United States Patent
Chae et al.

(10) Patent No.: US 10,586,575 B2
(45) Date of Patent: Mar. 10, 2020

(54) INTERFACE CIRCUIT FOR MULTI RANK MEMORY

(71) Applicant: SAMSUNG ELECTRONICS CO., LTD., Suwon-si, Gyeonggi-Do (KR)

(72) Inventors: Kwanyeob Chae, Seoul (KR); Hyungkweon Lee, Incheon (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/211,777

(22) Filed: Dec. 6, 2018

(65) Prior Publication Data
US 2019/0214063 A1    Jul. 11, 2019

(30) Foreign Application Priority Data

Jan. 10, 2018   (KR) .................. 10-2018-0003595
May 9, 2018    (KR) .................. 10-2018-0053348

(51) Int. Cl.
  *G11C 7/22*   (2006.01)
  *G06F 13/16*  (2006.01)
  *H03K 19/20*  (2006.01)

(52) U.S. Cl.
  CPC .......... *G11C 7/222* (2013.01); *G06F 13/1689* (2013.01); *H03K 19/20* (2013.01)

(58) Field of Classification Search
  CPC .................. G06F 12/0238; G06F 13/1689
  See application file for complete search history.

(56) References Cited

U.S. PATENT DOCUMENTS

| | | | |
|---|---|---|---|
| 7,412,616 B2 | 8/2008 | Matsui et al. | |
| 7,802,123 B2 | 9/2010 | Chae | |
| 8,121,237 B2 | 2/2012 | Stott et al. | |
| 8,135,555 B2* | 3/2012 | Best ............... | G06F 13/1689 702/106 |
| 9,047,929 B2 | 6/2015 | Seo et al. | |
| 9,087,568 B1 | 7/2015 | Ware | |
| 9,330,749 B1 | 5/2016 | Choksey et al. | |
| 2007/0217559 A1* | 9/2007 | Stott ............... | G11C 7/1051 375/355 |
| 2016/0260465 A1 | 9/2016 | Fung et al. | |
| 2017/0169877 A1 | 6/2017 | Zerbe et al. | |
| 2019/0079699 A1* | 3/2019 | Lee ............... | G06F 3/0659 |

* cited by examiner

*Primary Examiner* — Tuan T Nguyen
(74) *Attorney, Agent, or Firm* — F. Chau & Associates, LLC

(57) ABSTRACT

An electronic circuit including: a first delay line circuit to generate a first data strobe by delaying a second data strobe, such that an edge of the first data strobe is aligned within a first time interval; and a sampling circuit to sample the first data signal at the edge of the first data strobe, wherein plural data signals include the first data signal and a second data signal, wherein timings of the plural data signals deviate from a reference timing of a reference data strobe by plural time lengths, wherein the first data signal deviates from the reference timing by a first time length of the plural time lengths, and wherein an edge of the second data strobe is aligned within a second time interval, wherein a timing of the second data signal deviates from the reference timing by a shortest time length of the plural time lengths.

20 Claims, 16 Drawing Sheets

INTERFACE CIRCUIT FOR MULTI RANK MEMORY

CROSS-REFERENCE TO RELATED APPLICATIONS

This application claims priority under 35 U.S.C. § 119 to Korean Patent Application No. 10-2018-0003595 filed on Jan. 10, 2018, and Korean Patent Application No. 10-2018-0053348 filed on May 9, 2018, in the Korean Intellectual Property Office, the disclosures of which are incorporated by reference herein in their entireties.

TECHNICAL FIELD

The inventive concept relates to an electronic circuit, and more particularly, to an interface circuit for a memory.

DISCUSSION OF RELATED ART

As information devices such as a computer, a mobile phone, and a smartphone develop, more information is being stored in and processed by these devices. Accordingly, information devices require a high performance memory device. Since a semiconductor memory operates with a low power, the semiconductor memory is being used as a memory device.

To achieve a high-capacity memory system, a multi-rank memory system including a plurality of ranks is being used. In the multi-rank memory system, a plurality of ranks may share one channel. Accordingly, the total capacity of the memory system may increase without increasing the number of channels.

SUMMARY

According to an exemplary embodiment of the inventive concept, there is provided an electronic circuit including: a first delay line circuit configured to generate a first data strobe by delaying a second data strobe, such that an edge of the first data strobe is aligned within a first time interval where a first data signal has one logical value; and a sampling circuit configured to sample the first data signal at the edge of the first data strobe, wherein a plurality of data signals include the first data signal and a second data signal, wherein timings of the plurality of data signals deviate from a reference timing of a reference data strobe by a plurality of time lengths, wherein a timing of the first data signal deviates from the reference timing by a first time length of the plurality of time lengths, and wherein an edge of the second data strobe is aligned within a second time interval in which the second data signal has one logical value, wherein a timing of the second data signal deviates from the reference timing by a shortest time length of the plurality of time lengths.

According to an exemplary embodiment of the inventive concept, there is provided an electronic circuit including: a merge circuit configured to generate a first data strobe by delaying a second data strobe, such that an edge of the first data strobe is aligned within a first time interval where a first data signal has one logical value, and to sample the first data signal in response to the edge of the first data strobe, wherein a timing of the first data signal deviates from a reference timing of a reference data strobe by a first time length; and a split circuit configured to generate the second data strobe by delaying the reference data strobe, such that an edge of the second data strobe is aligned within a second time interval where a second data signal has one logical value, wherein a timing of the second data signal deviates from the reference timing by a second time length, wherein a plurality of data signals include the first data signal and the second data signal, wherein timings of the plurality of data signals deviate from the reference timing by a plurality of time lengths, and wherein the second time length is a shortest time length among the plurality of time lengths.

According to an exemplary embodiment of the inventive concept, there is provided an electronic circuit including: a first delay line circuit configured to generate a first data strobe by adjusting a timing of a second data strobe generated from a reference data strobe; and a sampling circuit configured to sample a first data signal based on the first data strobe, wherein a timing of the first data signal deviates from the reference data strobe by a first time length, wherein a second data signal is one of a plurality of data signals, wherein timings of the plurality of data signals deviate from the reference timing by a plurality of time lengths, and wherein a second data strobe has a timing for sampling the second data signal, wherein a timing of the second data signal deviates from the reference data strobe by a minimum time length of the plurality of time lengths.

BRIEF DESCRIPTION OF THE FIGURES

The above and other features of the inventive concept will become apparent by describing in detail exemplary embodiments thereof with reference to the accompanying drawings.

DETAILED DESCRIPTION OF THE EMBODIMENTS

Figure 1:
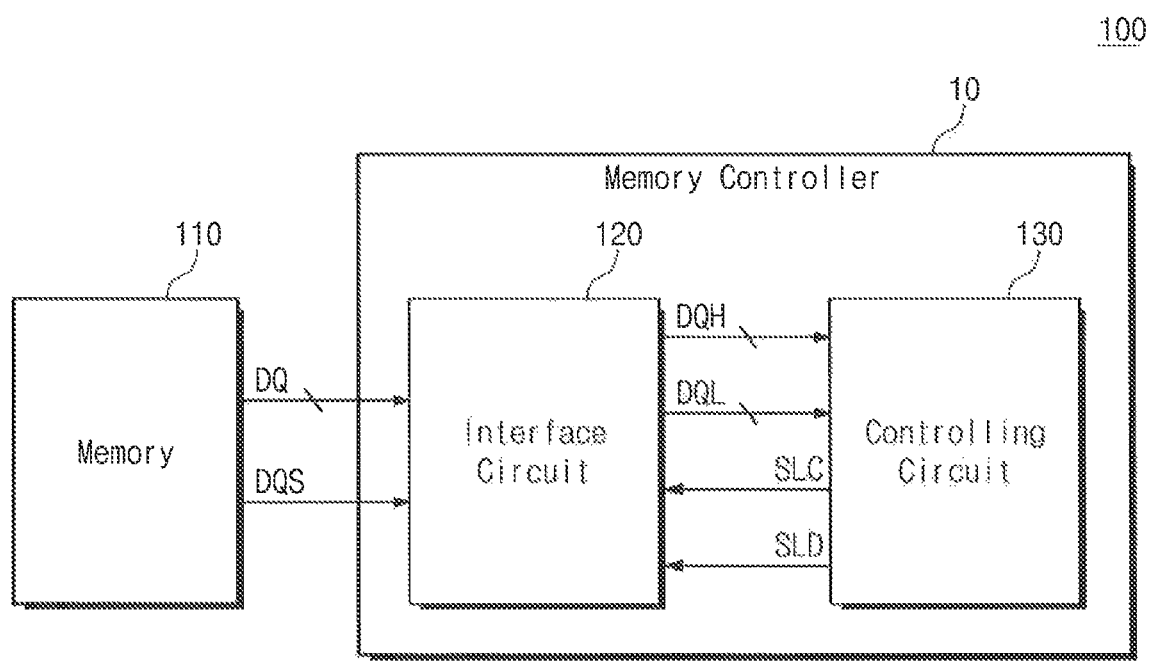
FIG. 1 is a block diagram illustrating a memory system according to an exemplary embodiment of the inventive concept.

FIG. 1 is a block diagram illustrating a memory system according to an exemplary embodiment of the inventive concept.

Referring to FIG. 1, a memory system 100 may include a memory 110 and a memory controller 10. The memory controller 10 may include an interface circuit 120 and a controlling circuit 130.

The memory 110 may store data and may receive and output data. The memory 110 may receive a command signal from the controlling circuit 130 through the interface circuit 120. The memory 110 may perform a read operation in response to the command signal. The memory 110 may read data stored in memory cells through the read operation. The memory cells are included in the memory 110. The memory 110 may generate a data signal DQ indicating the read data. For example, the data signal DQ may have a logical value to indicate data. The memory 110 may output the data signal DQ to the interface circuit 120.

The data signal DQ may indicate m-bit data corresponding to a period of a data strobe DQS (m being a natural number). For example, the data signal DQ may include "m" data signals. Each of the "m" data signals may indicate 1-bit data corresponding to the period of the data strobe DQS. The memory 110 may include one or more ranks, as will be described with reference to FIG. 2. A rank may be a unit of a memory which is configured to input/output data of a specific size. For example, one rank may be implemented with one memory module or the like. Each rank in the memory 110 may generate one or more data signals to be included in the data signal DQ.

For example, the memory 110 may include a volatile memory, which is configured to support a multi-rank system, such as a static random access memory (SRAM), a dynamic RAM (DRAM), or a synchronous DRAM (SDRAM), or a nonvolatile memory such as a flash memory, a phase-change RAM (PRAM), a magneto-resistive RAM (MRAM), a resistive RAM (ReRAM), or a ferroelectric RAM (FRAM). Alternatively, the memory 110 may include heterogeneous memories.

Each rank in the memory 110 may generate the data strobe DQS to be used to read the data signal DQ. The memory 110 may output the data strobe DQS generated by each rank to the interface circuit 120.

For example, the data strobe DQS may have a logical value high and a logical value low periodically. The data strobe DQS may include an interval (which may hereinafter be referred to as a "rising edge") where a logical value of the data strobe DQS changes from the logical value low to the logical value high. The data strobe DQS may include an interval (which may hereinafter be referred to as a "falling edge") where a logical value of the data strobe DQS changes from the logical value high to the logical value low. A configuration and operations of the memory 110 will be more fully described with reference to FIG. 2.

The interface circuit 120 may receive the data signal DQ and the data strobe DQS from the memory 110. The interface circuit 120 may receive a signal SLC and a signal SLD from the controlling circuit 130. For example, the interface circuit 120 may delay the data strobe DQS based on the signal SLC. For example, the interface circuit 120 may delay the data signal DQ or the data strobe DQS based on the signal SLD.

The interface circuit 120 may sample the data signal DQ generated from one or more ranks of the memory 110, in response to the data strobe DQS. For example, the interface circuit 120 may sample data indicated by the data signal DQ in response to the rising edge and the falling edge of the data strobe DQS. The interface circuit 120 may generate a data signal high DQH and a data signal low DQL through the sampling.

Since the data signal DQ indicates m-bit data corresponding to the period of the data strobe DQS, a pair of the data signal high DQH and the data signal low DQL may indicate m-bit data corresponding to the period of the data strobe DQS. For example, the data signal high DQH may include "m/2" data signal highs. The data signal low DQL may include "m/2" data signal lows. Each of the "m/2" data signal highs and the "m/2" data signal lows may indicate 1-bit data corresponding to the period of the data strobe DQS.

The data signal high DQH and the data signal low DQL may have a logical value of the data signal DQ. Accordingly, the pair of the data signal high DQH and the data signal low DQL may indicate data of the data signal DQ. The interface circuit 120 may output the data signal high DQH and the data signal low DQL to the controlling circuit 130. A configuration and an operation of the interface circuit 120 will be described with reference to FIG. 3.

FIG. 1 shows an example in which the interface circuit 120 and the controlling circuit 130 are independent of each other. However, according to another exemplary embodiment of the inventive concept, all or a part of the interface circuit 120 may be included in the controlling circuit 130.

The controlling circuit 130 may receive the data signal high DQH and the data signal low DQL through the interface circuit 120. The controlling circuit 130 may obtain data indicated by the data signal high DQH and the data signal low DQL. The obtained data may be used by a processing device such as a processor (refer to FIG. 16).

The controlling circuit 130 may store information about delays of the data signal DQ and the data strobe DQS. For example, the controlling circuit 130 may store information about delays of the data signal DQ and the data strobe DQS, which are determined based on training. The controlling circuit 130 may generate the signal SLC used to delay the data strobe DQS, based on the stored information. The controlling circuit 130 may generate the signal SLD used to delay the data signal DQ or the data strobe DQS, based on the stored information.

The delays, which are determined based on the training, may be associated with the rising edge and the falling edge of the data strobe DQS, and the data signal DQ. For example, due to the delays, since the rising edge and the falling edge of the data strobe DQS are positioned within a specific time interval, the interface circuit 120 may sample the data signal DQ with a sufficient margin. Delays of the data strobe DQS and the data signal DQ will be more fully described with reference to FIGS. 8, 9, 12, and 13.

Each of the signal SLC and the signal SLD are illustrated in FIG. 1 as one signal. However, each of the signal SLC and the signal SLD may include two or more different signals, which will be described with reference to FIGS. 4, 5, and 11.

Figure 2:
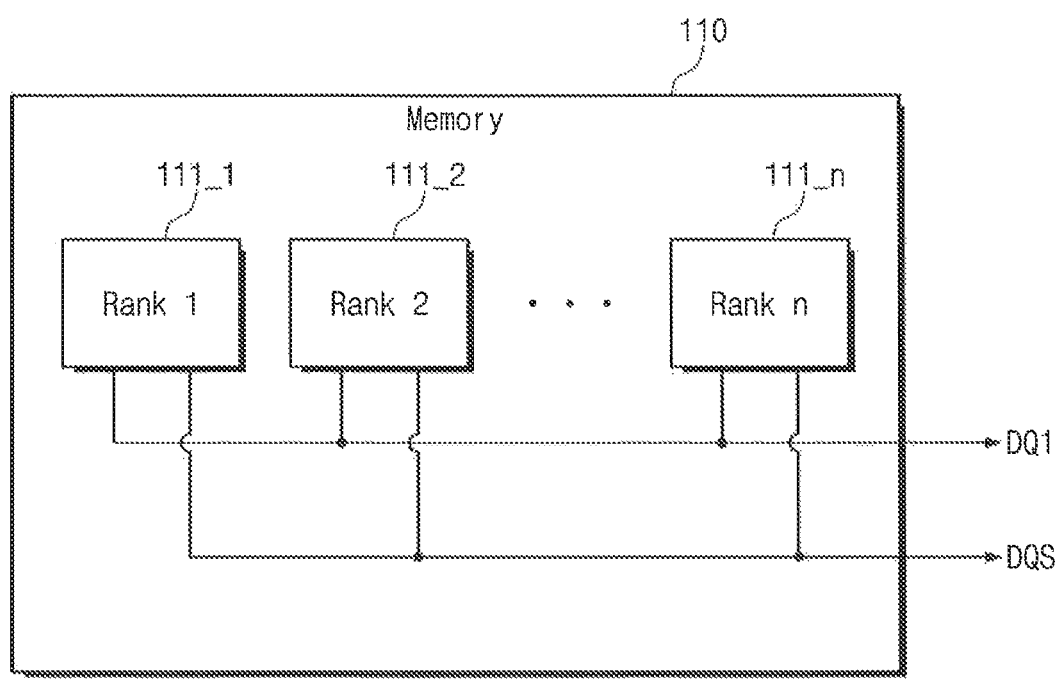
FIG. 2 is a block diagram illustrating a configuration of a memory of FIG. 1, according to an exemplary embodiment of the inventive concept.

FIG. 2 is a block diagram illustrating a configuration of a memory of FIG. 1, according to an exemplary embodiment of the inventive concept.

Referring to FIG. 2, the memory 110 may include first to n-th ranks 111_1 to 111_n. The memory 110 is illustrated in FIG. 2 as including three or more ranks. However, it is understood that the inventive concept may include less than three ranks.

As described with reference to FIG. 1, the data signal DQ may include "m" data signals. For example, the data signal DQ of FIG. 1 may include a data signal DQ1. The data signal DQ1 may indicate 1-bit data corresponding to the period of the data strobe DQS. Hereinafter, the data signal DQ1 of the "m" data signals included in the data signal DQ will be described with reference to FIGS. 2 to 6.

In reference to FIGS. 1 and 2, the ranks 111_1 to 111_n may generate the data signal DQ1 and the data strobe DQS in response to a command signal received from the controlling circuit 130 through the interface circuit 120. The data signal DQ1 and the data strobe DQS may be selectively generated by only one rank of the ranks 111_1 to 111_n, in response to the command signal.

For example, during a first time interval, the first rank 111_1 may generate the data signal DQ1 and the data strobe DQS. Afterwards, during a second time interval not overlapping the first time interval, the first rank 111_1 may not generate the data signal DQ1 and the data strobe DQS, and the second rank 111_2 may generate the data signal DQ1 and the data strobe DQS. In addition, during a third time interval not overlapping the first and second time intervals, a third rank 111_3 may generate the data signal DQ1 and the data strobe DQS. The data signal DQ1 and the data strobe DQS generated by one of the first to n-th ranks 111_1 to 111_n may be output to the interface circuit 120.

Figure 3:
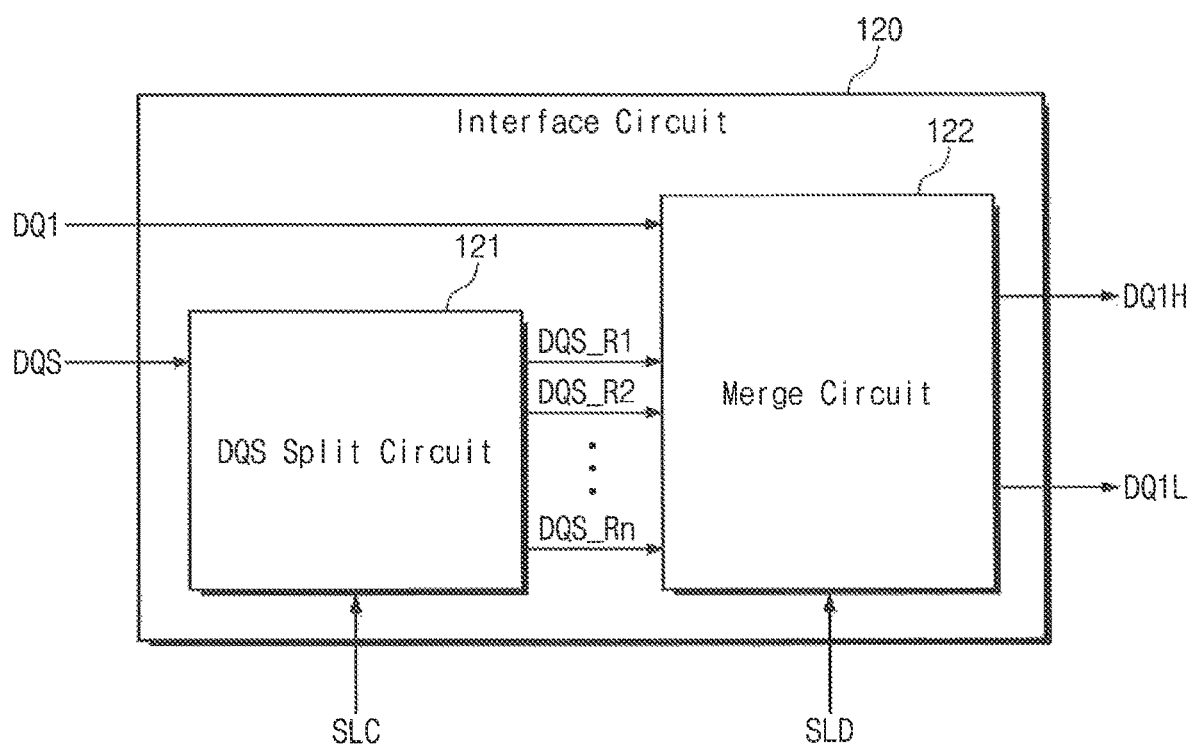
FIG. 3 is a block diagram illustrating a configuration of an interface circuit of FIG. 1, according to an exemplary embodiment of the inventive concept.

FIG. 3 is a block diagram illustrating a configuration of an interface circuit of FIG. 1, according to an exemplary embodiment of the inventive concept. Referring to FIG. 3, the interface circuit 120 may include a DQS split circuit 121 and a merge circuit 122.

The DQS split circuit 121 may receive the data strobe DQS from the memory 110. The DQS split circuit 121 may receive the signal SLC from the controlling circuit 130. The DQS split circuit 121 may generate data strobes DQS_R1 to DQS_Rn based on the data strobe DQS and the signal SLC.

For example, the DQS split circuit 121 may generate the data strobes DQS_R1 to DQS_Rn by delaying the data strobe DQS by specific times, respectively. An example method for generating the data strobes DQS_R1 to DQS_Rn will be described with reference to FIG. 4. The DQS split circuit 121 may output the first to n-th data strobes DQS_R1 to DQS_Rn to the merge circuit 122.

The merge circuit 122 may receive the data signal DQ1 from the memory 110. The merge circuit 122 may receive the data strobes DQS_R1 to DQS_Rn from the DQS split circuit 121.

For example, the merge circuit 122 may delay the data signal DQ1 or each of the data strobes DQS_R1 to DQS_Rn based on the signal SLD. An example configuration of the merge circuit 122 which is used to delay the data signal DQ1 will be described with reference to FIG. 5. An example configuration of the merge circuit 122 which is used to delay the data strobes DQS_R1 to DQS_Rn will be described with reference to FIG. 11.

Figure 5:
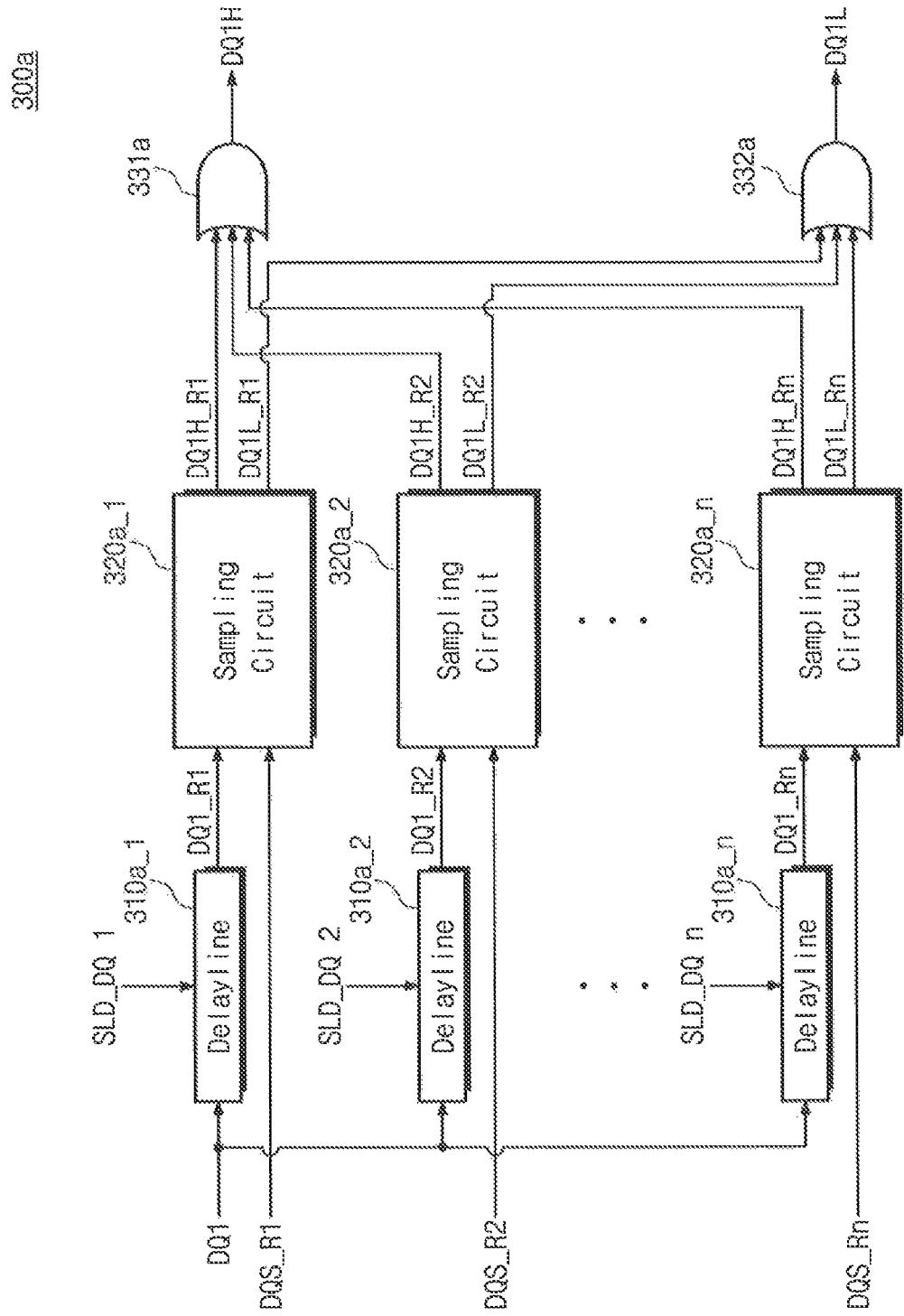
FIG. 5 is a block diagram illustrating a configuration of a merge circuit of FIG. 3, according to an exemplary embodiment of the inventive concept.

The merge circuit 122 may sample the delayed data signal DQ1 based on the data strobes DQS_R1 to DQS_Rn (refer to FIG. 5). Alternatively, the merge circuit 122 may sample the data signal DQ1 based on the delayed data strobes DQS1_R1 to DQS1_Rn (refer to FIG. 11).

The merge circuit 122 may generate a data signal high DQ1H and a data signal low DQ1L through the sampling. A pair of the data signal high DQ1H and the data signal low DQ1L may indicate data of the data signal DQ1. The merge circuit 122 may output the data signal high DQ1H and the data signal low DQ1L to the controlling circuit 130. A method in which the data signal high DQ1H and the data signal low DQ1L are output by the merge circuit 122 will be described with reference to FIGS. 5 and 6.

Figure 4:
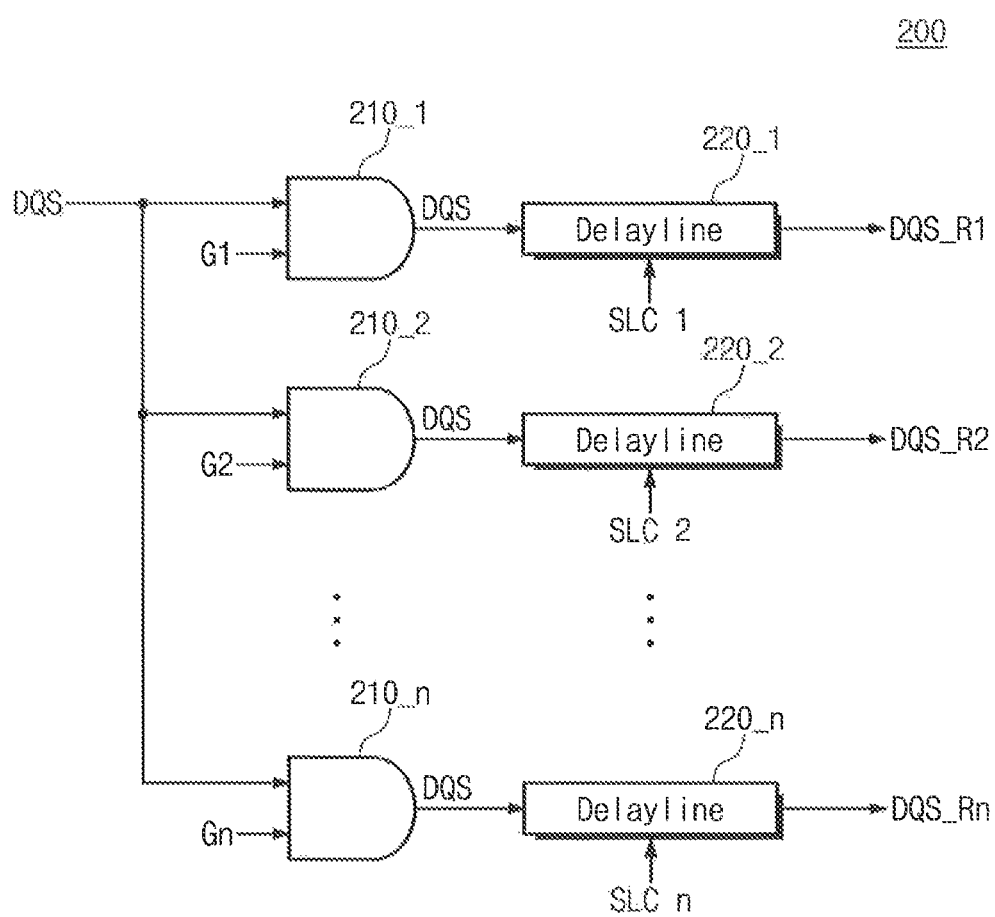
FIG. 4 is a block diagram illustrating a configuration of a DQS split circuit of FIG. 3, according to an exemplary embodiment of the inventive concept.

FIG. 4 is a block diagram illustrating a configuration of a DQS split circuit of FIG. 3, according to an exemplary embodiment of the inventive concept. The DQS split circuit 121 of FIG. 3 may include a DQS split circuit 200 of FIG. 4.

Referring to FIG. 4, the DQS split circuit 200 may include AND operators 210_1 to 210_n and delay lines 220_1 to 220_n. Each of the delay lines 220_1 to 220_n may include electronic circuits configured to delay a signal. For example, each of the delay lines 220_1 to 220_n may include one or more buffers.

FIG. 4 shows the DQS split circuit 200 including three or more AND operators 210_1 to 210_n and three or more delay lines 220_1 to 220_n, but the inventive concept may include less than three AND operators 210_1 to 210_n and less than three delay lines 220_1 to 220_n. The AND operators 210_1 to 210_n are illustrated in FIG. 4, but the inventive concept may include various other logic circuits configured to output substantially the same signal as a signal output from the AND operators 210_1 to 210_n with regard to specific input signals.

The DQS split circuit 200 may receive first to n-th gate signals G1 to Gn from the controlling circuit 130. The AND operators 210_1 to 210_n may respectively transfer the data strobe DQS to the delay lines 220_1 to 220_n in response to the first to n-th gate signals G1 to Gn.

As described with reference to FIG. 2, the data signal DQ1 may be generated by one of the first to n-th ranks 111_1 to 111_n in the memory 110. The memory 110 may output the data signal DQ1 corresponding to one of the first to n-th ranks 111_1 to 111_n under control of the controlling circuit 130. The gate signals G1 to Gn may be associated with a rank which generates the data signal DQ1.

For example, the controlling circuit 130 may output a gate signal, which has a logical value high to a rank generating the data signal DQ1, from among the first to n-th gate signals G1 to Gn. The AND operators 210_1 to 210_n may respectively output the data strobe DQS to the delay lines 220_1 to 220_n in response to the first to n-th gate signals G1 to Gn having a logical value high.

For example, the first gate signal G1 may be associated with the first rank 111_1. The first rank 111_1 may generate the data signal DQ1 in response to a command signal received from the controlling circuit 130. Correspondingly, the controlling circuit 130 may output the first gate signal G1 having a logical value high to the AND operator 210_1. In addition, the controlling circuit 130 may respectively output the second to n-th gate signals G2 to Gn having a logical value low to the AND operators 210_2 to 210_n.

The AND operator 210_1 may transfer the data strobe DQS to the delay line 220_1 in response to the first gate signal G1 having the logical value high. The AND operators 210_2 to 210_n may respectively output signals having the logical value low to the delay lines 220_2 to 220_n in response to the second to n-th gate signals G2 to Gn having the logical value low.

The delay lines 220_1 to 220_n may receive the data strobe DQS from the AND operators 210_1 to 210_n. The delay lines 220_1 to 220_n may receive first to n-th signals (SLC 1 to SLC n), respectively. The signal SLC of FIGS. 1 and 3 may include the first to n-th signals SLC 1 to SLC n input to the delay lines 220_1 to 220_n. As described with reference to FIG. 1, the signal SLC may be associated with delays of the data strobe DQS. Accordingly, the first to n-th signals SLC_1 to SLC_n may be associated with a delay of the data strobe DQS.

The delay lines 220_1 to 220_n may delay the data strobe DQS by a specific time, based on the first to n-th signals SLC_1 to SLC_n, respectively. How much each of the delay lines 220_1 to 220_n delays the data strobe DQS will be described with reference to FIGS. 8 and 12. The delay lines 220_1 to 220_n may delay the data strobe DQS to respectively generate first to n-th data strobes DQS_R1 to DQS_Rn. The delay lines 220_1 to 220_n may respectively output the first to n-th data strobes DQS_R1 to DQS_Rn to the merge circuit 122 of FIG. 3.

When one of the gate signals G1 to Gn has a logical value high and the remaining gate signals G1 to Gn have a logical value low, the data strobe DQS may be output from one of the AND operators 210_1 to 210_n, and signals having a logical value low may be output from the remaining AND operators 210_1 to 210_n. Accordingly, the DQS split circuit 200 may selectively output one of the data strobes DQS_R1 to DQS_Rn in response to the logical value high of one of the gate signals G1 to Gn.

Since the data strobe DQS_R1 is output based on the data strobe DQS, which is output in response to the logical value high of the first gate signal G1, the data strobe DQS_R1 may be associated with the first rank 111_1. As in the above description, the data strobes DQS_R2 to DQS_Rn may be associated with the second to n-th ranks 111_2 to 111_n, respectively. For example, since the data strobe DQS_R2 is output based on the data strobe DQS, which is output in response to the logical value high of the second gate signal G2, the data strobe DQS_R2 may be associated with the second rank 111_2.

FIG. 5 is a block diagram illustrating a configuration of a merge circuit of FIG. 3, according to an exemplary embodiment of the inventive concept. The merge circuit 122 of FIG. 3 may include a merge circuit 300a of FIG. 5.

Referring to FIG. 5, the merge circuit 300a may include delay lines 310a_1 to 310a_n, sampling circuits 320a_1 to 320a_n, and OR operators 331a and 332a. The delay lines 310a_1 to 310a_n may include electronic circuits configured to delay a signal. For example, each of the delay lines 310a_1 to 310a_n may include one or more buffers.

The OR operators 331a and 332a are illustrated in FIG. 5, however, it is understood that the inventive concept may include various other logic circuits configured to output substantially the same signal as a signal output from the OR operators 331a and 332a with regard to specific input signals.

Each of the delay lines 310a_1 to 310a_n may receive the data signal DQ1 from the memory 110. The delay lines 310a_1 to 310a_n may receive first to n-th signals SLD_DQ 1 to SLD_DQ n from the controlling circuit 130, respectively. The signal SLD of FIGS. 1 and 3 may include the first to n-th signals SLD_DQ 1 to SLD_DQ n. As described with reference to FIG. 1, the signal SLD may be associated with delays of the data signal DQ1. Accordingly, the first to n-th signals SLD_DQ 1 to SLD_DQ n may be associated with a delay of the data signal DQ1.

The delay lines 310a_1 to 310a_n may delay the data signal DQ1 by a specific time, based on the first to n-th signals SLD_DQ 1 to SLD_DQ n, respectively. How much each of the delay lines 310a_1 to 310a_n delays the data signal DQ will be described with reference to FIG. 9. The delay lines 310a_1 to 310a_n may delay the data signal DQ to respectively generate data signals DQ1_R1 to DQ1_Rn. The delay lines 310a_1 to 310a_n may output the data signals DQ1_R1 to DQ_Rn to the sampling circuits 320a_1 to 320a_n, respectively.

The sampling circuits 320a_1 to 320a_n may receive the data signals DQ1_R1 to DQ1_Rn from the delay lines 310a_1 to 310a_n, respectively. The sampling circuits 320a_1 to 320a_n may receive the data strobes DQS_R1 to DQS_Rn from the DQS split circuit 121 or 200.

The sampling circuits 320a_1 to 320a_n may respectively generate data signal highs DQ1H_R1 to DQ1H_Rn and data signal lows DQ1L_R1 to DQ1L_Rn in response to the data strobes DQS_R1 to DQS_Rn.

As described with reference to FIG. 1, the sampling circuits 320a_1 to 320a_n may respectively sample the data signals DQ1_R1 to DQ1_Rn in response to rising edges and falling edges of the data strobes DQS_R1 to DQS_Rn.

For example, the sampling circuits 320a_1 to 320a_n may respectively generate the data signal highs DQ1H_R1 to DQ1H_Rn from the data signals DQ1_R1 to DQ1_Rn in response to the rising edges of the data strobes DQS_R1 to DQS_Rn. The sampling circuits 320a_1 to 320a_n may respectively generate the data signal lows DQ1L_R1 to DQ1L_Rn from the data signals DQ1_R1 to DQ1_Rn in response to the falling edges of the data strobes DQS_R1 to DQS_Rn.

The sampling circuits 320a_1 to 320a_n may output the data signal highs DQ1H_R1 to DQ1H_Rn to the OR operator 331a. The sampling circuits 320a_1 to 320a_n may output the data signal lows DQ1L_R1 to DQ1L_Rn to the OR operator 332a.

As described with reference to FIG. 4, the DQS split circuit 121 or 200 may selectively output one of the data strobes DQS_R1 to DQS_Rn. Accordingly, one of the sampling circuits 320a_1 to 320a_n may operate in response to one of the data strobes DQS_R1 to DQS_Rn. Accordingly, one of the sampling circuits 320a_1 to 320a_n may output a data signal high and a data signal low, which correspond to the one of sampling circuits 320a_1 to 320a_n. The data signal high and the data signal low may indicate data of the data signal DQ1.

Sampling circuits, which do not receive a data strobe from the DQS split circuit 121 or 200, from among the sampling circuits 320a_1 to 320a_n may not perform a sampling operation. Sampling circuits, which receive signals having the logical value low from the DQS split circuit 121 or 200, from among the sampling circuits 320a_1 to 320a_n may output data signal highs and data signal lows, which do not indicate data of the data signal DQ1. For example, the data signal highs and the data signal lows, which do not indicate data of the data signal DQ1, may have a logical value of "0".

The OR operator 331a may receive one of the data signal highs DQ1H_R1 to DQ1H_Rn indicating data of the data signal DQ1 from one of the sampling circuits 320a_1 to 320a_n. The OR operator 332a may receive one of the data signal lows DQ1L_R1 to DQ1L_Rn indicating data of the data signal DQ1 from one of the sampling circuits 320a_1 to 320a_n. The OR operator 331a may output the data signal high DQ1H to the controlling circuit 130 in response to the received data signal high. The OR operator 332a may output the data signal low DQ1L to the controlling circuit 130 in response to the received data signal low.

The data signal high DQ1H output from the OR operator 331a may indicate data of the received data signal high. Accordingly, the data signal high DQ1H may have a logical value of the received data signal high. The data signal low DQ1L output from the OR operator 332a may indicate data of the received data signal low. Accordingly, the data signal low DQ1L may have a logical value of the received data signal low.

As described above, the merge circuit 300a may generate the data signal high DQ1H corresponding to one of the data signal highs DQ1H_R1 to DQ1H_Rn and the data signal low DQ1L corresponding to one of the data signal lows DQ1L_R1 to DQ1L_Rn in response to a selectively received one of the data strobes DQS_R1 to DQS_Rn. The merge circuit 300a may output the data signal high DQ1H and the data signal low DQ1L to the controlling circuit 130.

For example, referring to FIGS. 2, 4, and 5 together, the first rank 111_1 of the memory 110 may output the data signal DQ1 in response to the command signal from the controlling circuit 130. The controlling circuit 130 may output the first gate signal G1 to the AND operator 210_1. The DQS split circuit 200 may output the first data strobe DQS_R1 to the sampling circuit 320a_1 in response to the first gate signal G1. The sampling circuit 320a_1 may sample the data signal DQ1_R1 in response to the first data strobe DQS_R1. Through the sampling, the sampling circuit 320a_1 may generate the data signal high DQ1H_R1 and the data signal low DQ1L_R1.

The sampling circuit 320a_1 may output the data signal high DQ1H_R1 to the OR operator 331a. The sampling circuit 320a_1 may output the data signal low DQ1L_R1 to the OR operator 332a. The OR operator 331a may output the data signal high DQ1H to the controlling circuit 130 in response to the data signal high DQ1H_R1 provided from the sampling circuit 320a_1. The OR operator 332a may output the data signal low DQ1L to the controlling circuit 130 in response to the data signal low DQ1L_R1 provided from the sampling circuit 320a_1.

As described with reference to FIG. 4, the data strobe DQS_R1 may be associated with the first rank 111_1. Accordingly, the data signal DQ1H_R1, which is output based on the data strobe DQS_R1, may be associated with the first rank 111_1. Accordingly, the data signals DQ1H_R2 to DQ1H_Rn may be associated with the second to n-th ranks 111_2 to 111_n, respectively. For example, the data signal DQ1H_R2, which is output based on the data strobe DQS_R2, may be associated with the second rank 111_2.

The data signal high DQ1H and the data signal low DQ1L may be generated in response to the data strobes DQS_R2 to DQS_Rn similar to the way in which the data signal high DQ1H and the data signal low DQ1L are generated in response to the data strobe DQS_R1. Therefore, additional descriptions will be omitted to avoid redundancy. An operation of the sampling circuits 320a_1 to 320a_n will be more fully described with reference to FIG. 6.

As described with reference to FIG. 1, the data signal DQ may include "m" data signals including the data signal DQ1. Accordingly, the merge circuit 122 of FIG. 3 may include "m" merge circuits respectively corresponding to the "m" data signals. For example, in the case where "m" is eight, the merge circuit 122 may include eight merge circuits having a configuration the same as or similar to the configuration of the merge circuit 300a (refer to FIG. 10).

Figure 6:
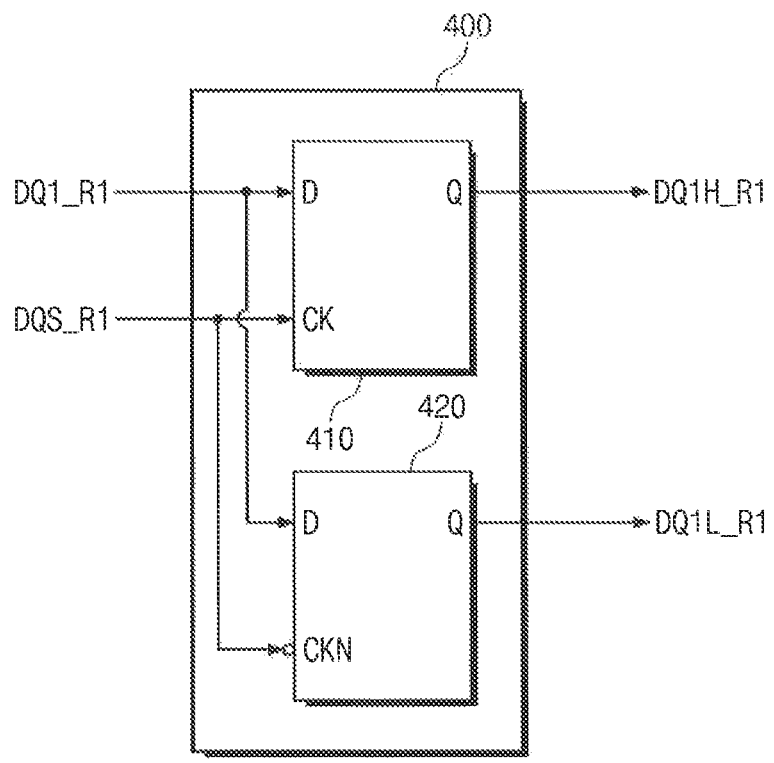
FIG. 6 is a block diagram illustrating a configuration of a sampling circuit of FIG. 5, according to an exemplary embodiment of the inventive concept.

FIG. 6 is a block diagram illustrating a configuration of a sampling circuit of FIG. 5, according to an exemplary embodiment of the inventive concept.

The sampling circuits 320a_1 to 320a_n of FIG. 5 may include a sampling circuit 400 of FIG. 6. Hereinafter, the sampling circuit 400 included in the sampling circuit 320a_1 will be described. The sampling circuit 400 may include a flip-flop 410 and a flip-flop 420.

Referring to FIGS. 4, 5, and 6 together, the flip-flop 410 may receive the data signal DQ1_R1 from the delay line 310a_1 as an input signal "D". The flip-flop 410 may receive the data strobe DQS_R1 from the delay line 220_1 as a clock CK. The flip-flop 410 may output the data signal high DQ1H_R1 having a logical value of the data signal DQ1_R1 in response to a rising edge of the data strobe DQS_R1. The logical value of the data signal high DQ1H_R1 may be maintained during a time interval when the data strobe DQS_R1 has a logical value high.

The flip-flop 420 may receive the data signal DQ1_R1 from the delay line 310a_1 as an input signal "D". The flip-flop 420 may receive the data strobe DQS_R1 from the delay line 220_1 as a clock CKN. The flip-flop 420 may output the data signal low DQ1L_R1 having a logical value of the data signal DQ1_R1 in response to a falling edge of the data strobe DQS_R1. The logical value of the data signal low DQ1L_R1 may be maintained during a time interval when the data strobe DQS_R1 has a logical value low.

As described with reference to FIGS. 4 and 5, the data signal DQ1_R1 and the data strobe DQS_R1 may be associated with the first rank 111_1. Accordingly, the data signal high DQ1H_R1 and the data signal low DQ1L_R1 which are output based on the data signal DQ1_R1 and the data strobe DQS_R1 may be associated with the first rank 111_1.

Figure 7:
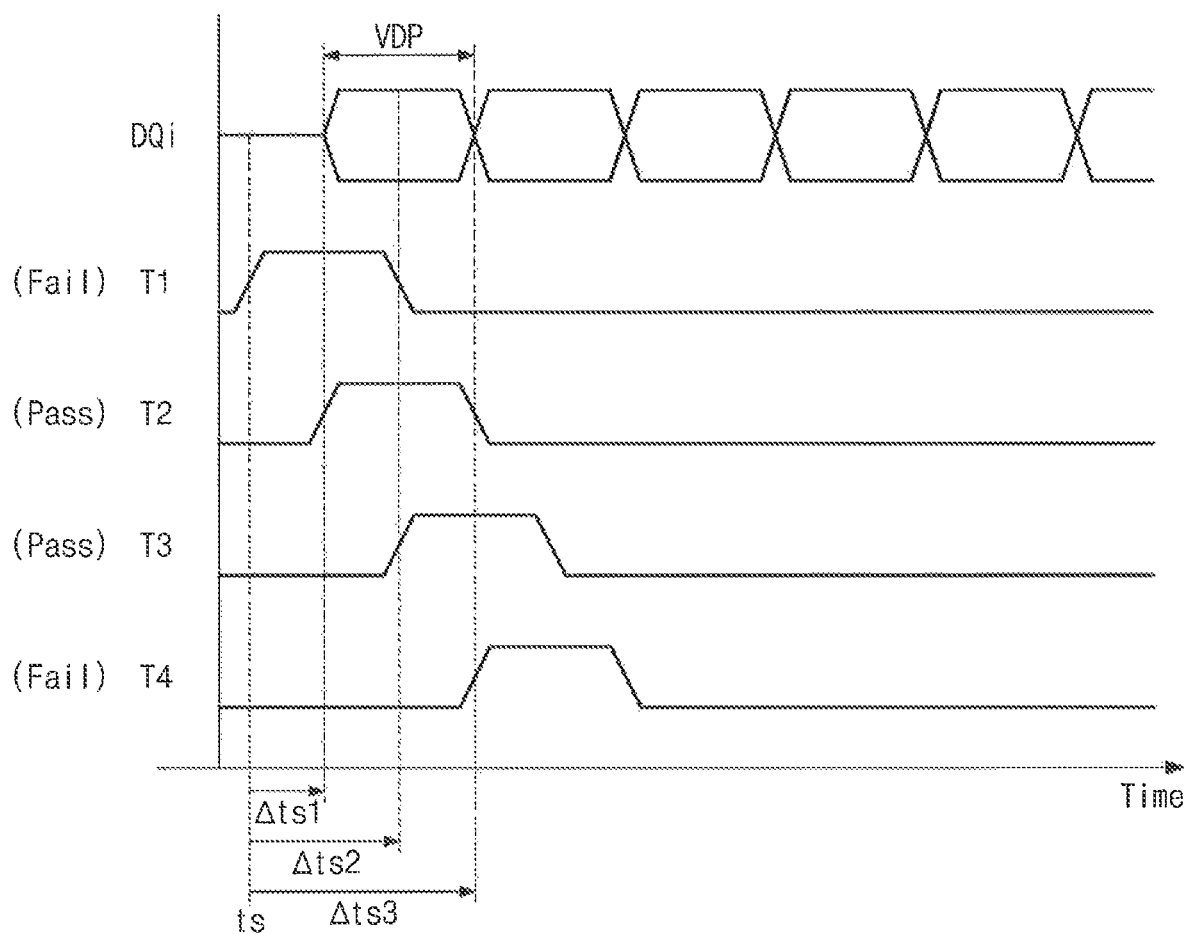
FIG. 7 is a timing diagram illustrating training for determining delays associated with a data signal and a data strobe of FIG. 1, according to an exemplary embodiment of the inventive concept.

FIG. 7 is a timing diagram illustrating training for determining delays associated with a data signal and a data strobe of FIG. 1, according to an exemplary embodiment of the inventive concept.

The first to n-th ranks 111_1 to 111_n of the memory 110 may generate a data signal DQi for training purposes. For example, the data signal DQi may be one, which is selectively generated from one of the first to n-th ranks 111_1 to 111_n, of "m" data signals.

For training purposes, the controlling circuit 130 may sequentially input signals T1, T2, T3 and T4 to sampling circuits included in the merge circuit 122. The signal T1 may have a rising edge at a time point "ts". The signal T2 may be generated by delaying the signal T1 by a time length Δts1. The signal T3 may be generated by delaying the signal T1 by a time length Δts2. The signal T4 may be generated by delaying the signal T1 by a time length Δts3. The time length Δts3 may be longer than the time length Δts2, and the time length Δts2 may be longer than the time length Δts1.

The sampling circuit included in the merge circuit 122 may sample the data signal DQi based on the signals T1 to T4. The data signal DQi may indicate data from a specific time point. The time point "ts" may precede the specific time point. Accordingly, data of the data signal DQi may not be sampled in response to the signal T1. The data signal DQi may indicate data after "Δts1" from the time point "ts". Accordingly, the data of the data signal DQi may be sampled in response to the signal T2. The data signal DQi may indicate data after "Δts2" from the time point "ts". Accordingly, the data of the data signal DQi may be sampled in response to the signal T3. The data signal DQi may not indicate data after "Δts3" from the time point "ts". Accordingly, data of the data signal DQi may not be sampled in response to the signal T4.

The controlling circuit 130 may determine how much time the data signal DQi deviates from the reference time point "ts" (e.g., the controlling circuit 130 may decide a skew of the data signal DQi), based on the training described with reference to FIG. 7. For example, the controlling circuit 130 may determine that the data signal DQi deviates from the reference time point "ts" by a time length Δts1. The controlling circuit 130 may determine delays of the data signal DQi and the data strobe DQS, based on the time lengths Δts1, Δts2, and Δts3. For example, the controlling circuit 130 may determine a delay such that an edge of the data strobe DQS is positioned at a time point between a time point after the time length Δts1 from the reference time point "ts" and a time point after the time length Δts3 from the reference time point "ts". An example method in which a delay is decided by the controlling circuit 130 will be more fully described with reference to FIGS. 8, 9, 12, and 13.

In FIG. 7, the data signal DQi may have a length of a time interval VDP as a period.

Figure 8:
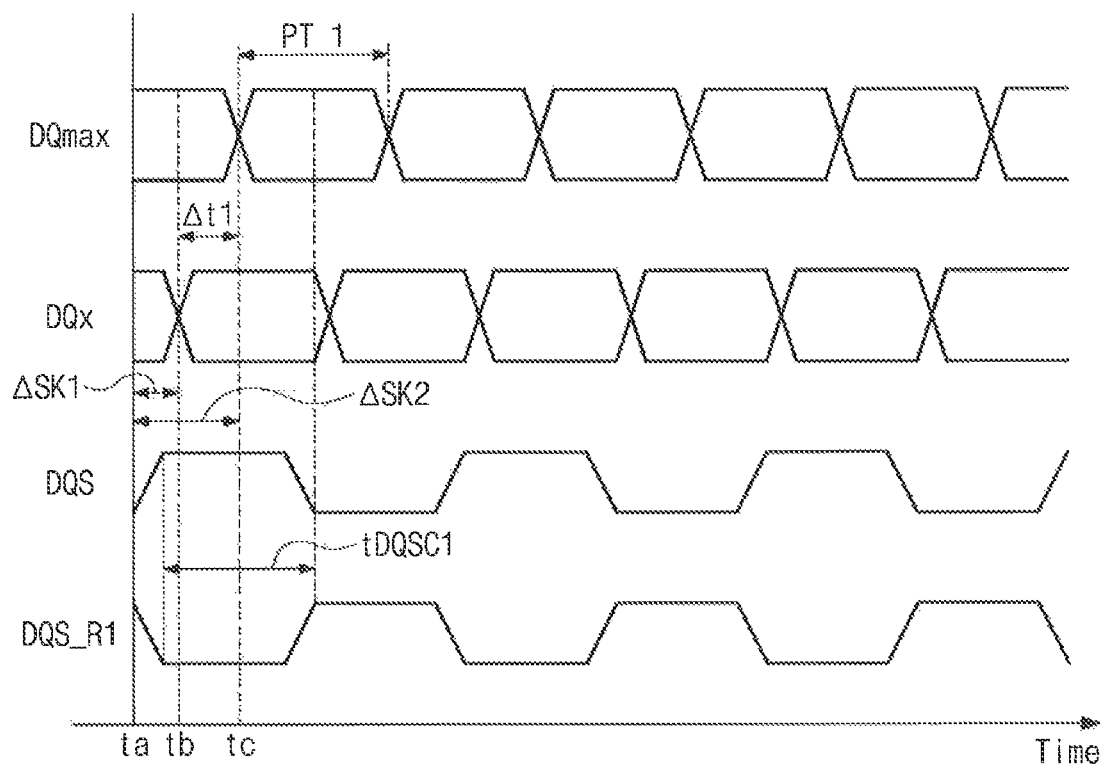
FIG. 8 is a timing diagram illustrating variations of signals generated by a memory system of FIG. 1, according to an exemplary embodiment of the inventive concept.

FIG. 8 is a timing diagram illustrating changes of signals generated by a memory system of FIG. 1, according to an exemplary embodiment of the inventive concept.

Hereinafter, the data signal DQ generated by the first rank 111_1 of FIG. 2 and signals associated with the data signal DQ generated by the first rank 111_1 will be described with reference to FIG. 8. As described with reference to FIG. 1, the data signal DQ may include "m" data signals. A data signal DQx of FIG. 8 may be one of the "m" data signals included in the data signal DQ. Accordingly, the data signal DQx may be generated by the first rank 111_1. Variations of data signals generated by the second to n-th ranks 111_2 to 111_n are similar to a variation of a data signal generated by the first rank 111_1, and thus, additional descriptions thereof will be omitted to avoid redundancy.

A specific time point of the "m" data signals (included in the data signal DQ) generated from the memory 110 may be aligned with a reference time point. For example, the specific time point may be a time point when data indicated by each of the data signal DQx and data signal DQmax varies. In an example of FIG. 8, the specific time point may be a time point tb or a time point tc. The reference time point may be a time point when a logical value of the data strobe DQS starts to vary. In the example of FIG. 8, the reference time point may be a time point ta.

A skew may occur due to noises which are generated by various factors in the process of transferring the data signal DQx. For example, the data signal DQx generated by the first rank 111_1 may deviate from the data strobe DQS by various time lengths. In other words, the data signal DQx may lag or lead the data strobe DQS by a specific time length. The time point "tb" of the data signal DQx may deviate from the reference time point "ta" of the data strobe DQS.

Since noises which affect the data signal DQx vary with a time, data signals included in the data signal DQ may deviate from the data strobe DQS by different time lengths. The data signal DQmax may be a data signal, which deviates by the longest time length, from among the data signals included in the data signal DQ. The time point "tc" corresponds to how much time the data signal DQmax may deviate from the reference time point "ta" of the data strobe DQS. In the example of FIG. 8, ΔSK1 may indicate a time length by which the data signal DQx deviates from the data strobe DQS. ΔSK2 may indicate the longest time length of time lengths by which the data signal DQx deviates from the data strobe DQS. In other words, a time length by which the data signal DQmax deviates from the data strobe DQS.

The data strobe DQS of FIG. 8 may be the data strobe DQS of FIGS. 1 to 4. A data strobe DQS_R1 of FIG. 8 may be the data strobe DQS_R1 of FIGS. 3 to 6.

The data signal DQmax and the data signal DQx may have a length of a time interval PT 1 as a period. Accordingly, each of the data signal DQmax and the data signal DQx may indicate 1-bit data in the unit of the length of the time interval PT 1. Since a time length by which the data signal DQmax deviates from the data strobe DQS is longer than a time length by which the data signal DQx deviates from the data strobe DQS, the data signal DQmax may lag the data signal DQx by the time interval Δt1.

The period of the data strobe DQS may be substantially identical to the period of the data signal DQx and the data signal DQmax. As described with reference to FIG. 4, the delay line 220_1 may delay the data strobe DQS based on the signal SLC_1 to output the data strobe DQS_R1. Accordingly, the data strobe DQS_R1 may lag the data strobe DQS by a time interval tDQSC1. As described with reference to FIG. 1, the time interval tDQSC1 may have a length determined based on the training described with reference to FIG. 7. The signal SLC_1 may indicate a length of the time interval tDQSC1.

For example, the controlling circuit 130 may determine a length of the time interval tDQSC1 based on the skew ΔSK2 of the data signal DQmax obtained through the training. The time interval tDQSC1 may have a length for aligning the data strobe DQS with the data signal DQmax. In the example of FIG. 8, the time interval tDQSC1 may have a length for aligning rising edges and falling edges of the data strobe DQS_R1, which is obtained by delaying the data strobe DQS, within time intervals when the data signal DQmax has a specific logical value. For example, a rising edge of the data strobe DQS_R1 may be aligned within the time interval PT 1. Accordingly, a time point when the data strobe DQS_R1 starts to have the logical value high may be aligned with the center of the time interval PT 1.

Figure 9:
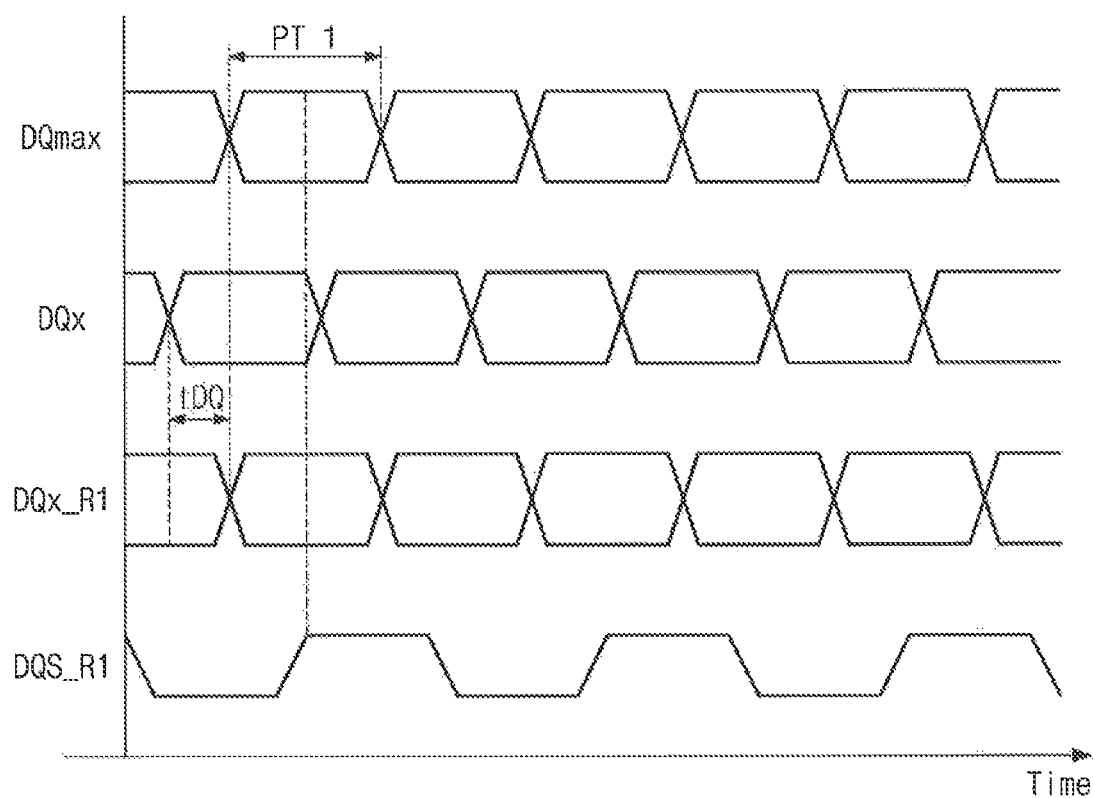
FIG. 9 is a timing diagram illustrating variations of signals generated by a memory system of FIG. 1, according to an exemplary embodiment of the inventive concept.

FIG. 9 is a timing diagram illustrating variations of signals generated by a memory system of FIG. 1, according to an exemplary embodiment of the inventive concept.

A data signal DQmax, a data signal DQx, and a data strobe DQS_R1 of FIG. 9 may be the data signal DQmax, the data signal DQx, and the data strobe DQS_R1 of FIG. 8, respectively. A data signal DQx_R1 of FIG. 9 may be generated by delaying the data signal DQx at the merge circuit 122 of FIG. 3.

As described with reference to FIG. 5, the data signals DQ1_R1 to DQ1_Rn may be generated from the data signal DQ1. As in the above description, "n" data signals may be generated from the data signal DQx. The data signal DQx_R1 may be one of the "n" data signals. The data signal DQx_R1 may lag the data signal DQx by a time interval tDQ. As described with reference to FIG. 1, the time interval tDQ may have a length determined based on the training described with reference to FIG. 7. A signal SLD_DQ 1 (e.g., one of the signals input to the delay line 310a_1) may indicate a length of the time interval tDQ.

For example, the controlling circuit 130 may determine a length of the time interval tDQSC1 based on the skew ΔSK1 of the data signal DQx obtained through the training. The time interval tDQ may have a length for aligning the data signal DQx with the data signal DQmax. In the example of FIG. 9, the time interval tDQ may have a length for aligning rising edges and falling edges of the data signal DQx_R1, which is obtained by delaying the data signal DQx, with rising edges and falling edges of the data signal DQmax, respectively. Accordingly, a variation due to a time of the data signal DQx_R1 may be similar to a variation due to a time of the data signal DQmax.

The data strobe DQS_R1 aligned with the center of the time interval PT 1 is above described with reference to FIG. 9. However, it is understood that the inventive concept may generate the data strobe DQS_R1 to have an edge aligned within other parts of the time interval PT 1.

Through the method described with reference to FIGS. 8 and 9, the interface circuit 120 may delay the data strobes DQS_R1 to DQS_Rn based on the signal SLC such that the data strobes DQS_R1 to DQS_Rn are aligned with the data signal DQmax. As in the method in which the "n" data signals DQ1_R1 to DQ1_Rn are generated from the data signal DQ1 by the delay lines 310*a*_1 to 310*a*_*n*, "n" data signals may be generated from the data signal DQx by the delay lines 310*a*_1 to 310*a*_*n*. The interface circuit 120 may delay the "n" data signals based on the signal SLD such that the "n" data signals generated from the data signal DQx are respectively aligned with the data strobes DQS_R1 to DQS_Rn.

Through the process described with reference to FIGS. 8 and 9, the interface circuit 120 may delay the data signal DQx such that rising edges and falling edges of the data strobe DQS_R1 are aligned with time intervals where the data signal DQx has a specific logical value. As in the above-described process, rising edges and falling edges of the data strobes DQS_R1 to DQS_Rn may be respectively aligned with data signals generated from the data signal DQx, and thus, additional descriptions thereof will be omitted to avoid redundancy.

As the data strobe DQS_R1 is aligned with the data signal DQx_R1, the sampling circuit 320*a*_1 of FIG. 5 may sample the data signal DQx_R1 with a sufficient margin, based on the data strobe DQS_R1. As in the above description, the sampling circuits 320*a*_2 to 320*a*_*n* of FIG. 5 may respectively sample data signals, which are generated from the data signal DQx, with a sufficient margin.

Figure 10:
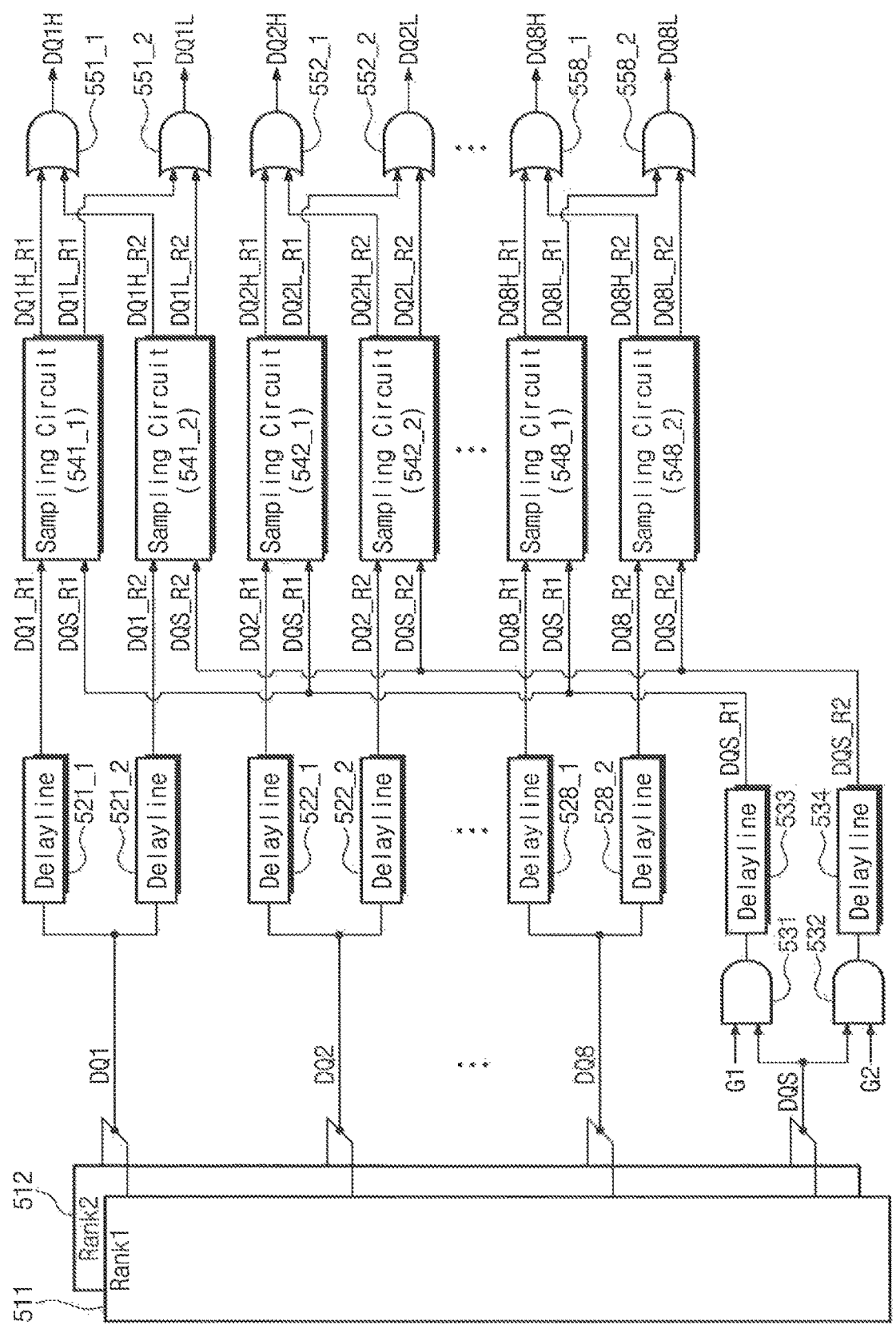
FIG. 10 is a block diagram illustrating a memory and an interface circuit of a merge circuit of FIG. 5, according to an exemplary embodiment of the inventive concept.

FIG. 10 is a block diagram illustrating a memory and an interface circuit of a merge circuit of FIG. 5, according to an exemplary embodiment of the inventive concept.

As described with reference to FIG. 1, the memory 110 may generate "m" data signals by "n" ranks. For example, a description will be given with respect to two ranks 511 and 512 and eight data signals DQ1 to DQ8 generated by the two ranks 511 and 512.

The memory 110 of FIG. 1 may include the first and second ranks 511 and 512 of FIG. 10. The DQS split circuit 121 of FIG. 3 may include AND operators 531 and 532 and delay lines 533 and 534 of FIG. 10. The merge circuit 122 of FIG. 3 may include delay lines 521_1 to 528_1, delay lines 521_2 to 528_2, sampling circuits 541_1 to 548_1, sampling circuits 541_2 to 548_2, OR operators 551_1 to 558_1, and OR operators 551_2 to 558_2 of FIG. 10.

Configurations and operations of the first and second ranks 511 and 512 of FIG. 10 are similar to those described with reference to the first and second ranks 111_1 and 111_2 of FIG. 2, and thus, additional descriptions thereof will be omitted to avoid redundancy. Configurations and operations of the AND operators 531 and 532 and the delay lines 533 and 534 of FIG. 10 are similar to those described with reference to the AND operators 210_1 to 210_*n* and the delay lines 220_1 to 220_*n* of FIG. 4, and thus, additional descriptions thereof will be omitted to avoid redundancy. Configurations and operations of the delay lines 521_1 to 528_1, the delay lines 521_2 to 528_2, the sampling circuits 541_1 to 548_1, the sampling circuits 541_2 to 548_2, the OR operators 551_1 to 558_1, and the OR operators 551_2 to 558_2 are similar to those described with reference to the delay lines 310*a*_1 to 310*a*_*n*, the sampling circuits 320*a*_1 to 320*a*_*n*, and the OR operators 331*a* and 332*a* of FIG. 5, and thus, additional descriptions thereof will be omitted to avoid redundancy.

One of the first and second ranks 511 and 512 may generate the data signals DQ1 to DQ8 under control of the controlling circuit 130. The AND operators 531 and 532 and the delay lines 533 and 534 may generate data strobes DQS_R1 and DQS_R2 in response to the first and second gate signals G1 and G2, respectively. The data strobe signal DQS is also input to the AND operators 531 and 532. The delay lines 521_1 to 528_1 may respectively delay the data signals DQ1 to DQ8 to generate data signals DQ1_R1 to DQ8_R1. The delay lines 521_2 to 528_2 may respectively delay the data signals DQ1 to DQ8 to generate data signals DQ1_R2 to DQ8_R2.

The sampling circuits 541_1 to 548_1 may generate data signal highs DQ1H_R1 to DQ8H_R1 and data signal lows DQ1L_R1 to DQ8L_R1 by sampling the data signals DQ1_R1 to DQ8_R1 based on the data strobe DQS_R1. The sampling circuits 541_2 to 548_2 may generate data signal highs DQ1H_R2 to DQ8H_R2 and data signal lows DQ1L_R2 to DQ8L_R2 by sampling the data signals DQ1_R2 to DQ8_R2 based on the data strobe DQS_R2.

The OR operators 551_1 to 558_1 may generate the data signal highs DQ1H to DQ8H based on the data signal highs DQ1H_R1 to DQ8H_R1 and the data signal highs DQ1H_R2 to DQ8H_R2. The OR operators 551_2 to 558_2 may generate the data signal lows DQ1L to DQ8L based on the data signal lows DQ1L_R1 to DQ8L_R1 and the data signal lows DQ1L_R2 to DQ8L_R2.

Figure 11:
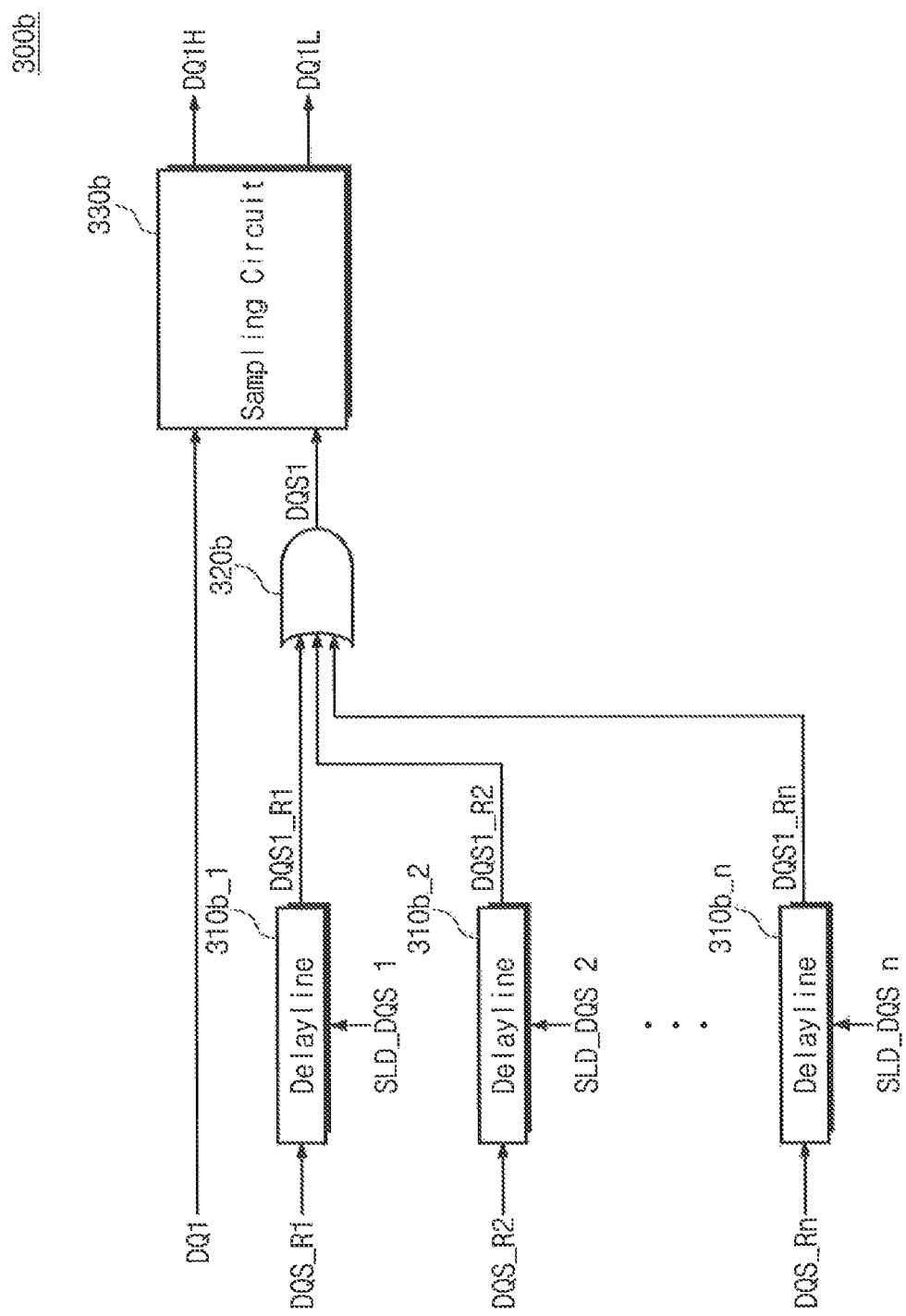
FIG. 11 is a block diagram illustrating a merge circuit of FIG. 3, according to an exemplary embodiment of the inventive concept.

FIG. 11 is a block diagram illustrating a configuration of a merge circuit of FIG. 3, according to an exemplary embodiment of the inventive concept. The merge circuit 122 of FIG. 3 may include a merge circuit 300*b* of FIG. 11.

Referring to FIG. 11, the merge circuit 300*b* may include delay lines 310*b*_1 to 310*b*_*n*, an OR operator 320*b*, and a sampling circuit 330*b*. Each of the delay lines 310*b*_1 to 310*b*_*n* may include electronic circuits configured to delay a signal. For example, the delay lines 310*b*_1 to 310*b*_*n* may include one or more buffers.

The OR operator 320*b* is illustrated in FIG. 11, however, it is understood that the inventive concept may include various other logic circuits configured to output substantially the same signal as a signal output from the OR operator 320*b* with regard to specific input signals.

The delay lines 310*b*_1 to 310*b*_*n* may respectively receive the data strobes DQS_R1 to DQS_Rn from the DQS split circuit 121 or 200. The delay lines 310*b*_1 to 310*b*_*n* may receive first to n-th signals SLD_DQS 1 to SLD_DQS n from the controlling circuit 130, respectively. The signal SLD of FIGS. 1 and 3 may include the first to n-th signals SLD_DQS 1 to SLD_DQS n. As described with reference to FIG. 1, the signal SLD may be associated with delays of the data strobe DQS. Accordingly, the first to n-th signals SLD_DQS 1 to SLD_DQS n may be associated with a delay of the data strobe DQS.

The delay lines 310*b*_1 to 310*b*_*n* may respectively delay the data strobes DQS_R1 to DQS_Rn by a specific time length, based on the first to n-th signals SLD_DQS 1 to SLD_DQS n, respectively. How much time the delay lines 310*b*_1 to 310*b*_*n* delay the data strobes DQS_R1 to DQS_Rn by will be described with reference to FIG. 13. The delay lines 310*b*_1 to 310*b*_*n* may respectively delay the data strobes DQS_R1 to DQS_Rn to generate delayed data strobes DQS1_R1 to DQS1_Rn. The delay lines 310*b*_1 to 310b_n may output the delayed data strobes DQS1_R1 to DQS1_Rn to the OR operator 320b, respectively.

The OR operator 320b may receive the delayed data strobes DQS1_R1 to DQS1_Rn. The OR operator 320b may output the delayed data strobe DQS1 to the sampling circuit 330b in response to the delayed data strobes DQS1_R1 to DQS1_Rn. The delayed data strobe DQS1 may correspond to one of the delayed data strobes DQS1_R1 to DQS1_Rn. For example, the delayed data strobe DQS1 may indicate a logical value of one of the delayed data strobes DQS1_R1 to DQS1_Rn.

The sampling circuit 330b may receive the data signal DQ1 from the memory 110. The sampling circuit 330b may generate the data signal high DQ1H and the data signal low DQ1L having a logical value of the data signal DQ1 in response to the delayed data strobe DQS1 and the delayed data strobe DQS1. In other words, the sampling circuit 330b may sample the data signal DQ1 based on the delayed data strobes DQS1_R1 to DQS1_Rn. The sampling circuit 330b may output the data signal high DQ1H and the data signal low DQ1L to the controlling circuit 130. A configuration and operations of the sampling circuit 330b are similar to those described with reference to FIG. 6, and thus, additional descriptions thereof will be omitted to avoid redundancy.

As described with reference to FIG. 4, the DQS split circuit 200 may selectively output one of the data strobes DQS_R1 to DQS_Rn. Accordingly, the merge circuit 300b may generate the delayed data strobe DQS1 in response to one, which is selectively output, of the data strobes DQS_R1 to DQS_Rn.

For example, referring to FIGS. 2 and 4 together with FIG. 11, the first rank 111_1 of the memory 110 may output the data signal DQ1 in response to the command signal of the controlling circuit 130. The controlling circuit 130 may output the first gate signal G1 to the AND operator 210_1. The DQS split circuit 200 may output the data strobe DQS_R1 to the delay line 310b_1 in response to the first gate signal G1. The delay line 310b_1 may delay the data strobe DQS_R1 based on the first signal SLD_DQS 1. The delay line 310b_1 may generate the delayed data strobe DQS1_R1.

The delay line 310b_1 may output the delayed data strobe DQS1_R1 to the OR operator 320b. The OR operator 320b may output the delayed data strobe DQS1 to the sampling circuit 330b in response to the delayed data strobe DQS1_R1. The sampling circuit 330b may generate a pair of the data signal high DQ1H and the data signal low DQ1L having a logical value of the data signal DQ1 in response to the delayed data strobe DQS1.

The data signal high DQ1H and the data signal low DQ1L may be generated in response to the data strobes DQS_R2 to DQS_Rn similar to the way in which the data signal high DQ1H and the data signal low DQ1L are generated in response to the data strobe DQS_R1. Therefore, additional descriptions will be omitted to avoid redundancy.

Referring to FIGS. 5 and 11, the merge circuit 300b of FIG. 11 may include sampling circuits, the number of which is smaller than the number of sampling circuits of the merge circuit 300a of FIG. 5. For example, the merge circuit 300a of FIG. 5 may include as many sampling circuits 320a_1 to 320a_n as there are ranks in FIG. 2. The merge circuit 300b of FIG. 11 may include the one sampling circuit 330b. Accordingly, the merge circuit 300b of FIG. 11 may use a smaller area than the merge circuit 300a of FIG. 5. In addition, the merge circuit 300b of FIG. 11 may consume less power than the merge circuit 300a of FIG. 5.

As described with reference to FIG. 1, the data signal DQ may include "m" data signals including the data signal DQ1. Accordingly, the merge circuit 122 of FIG. 3 may include "m" merge circuits respectively corresponding to the "m" data signals. For example, in the case where "m" is eight, the merge circuit 122 may include eight merge circuits having a configuration which is similar to the configuration of the merge circuit 300b (refer to FIG. 14).

Figure 12:
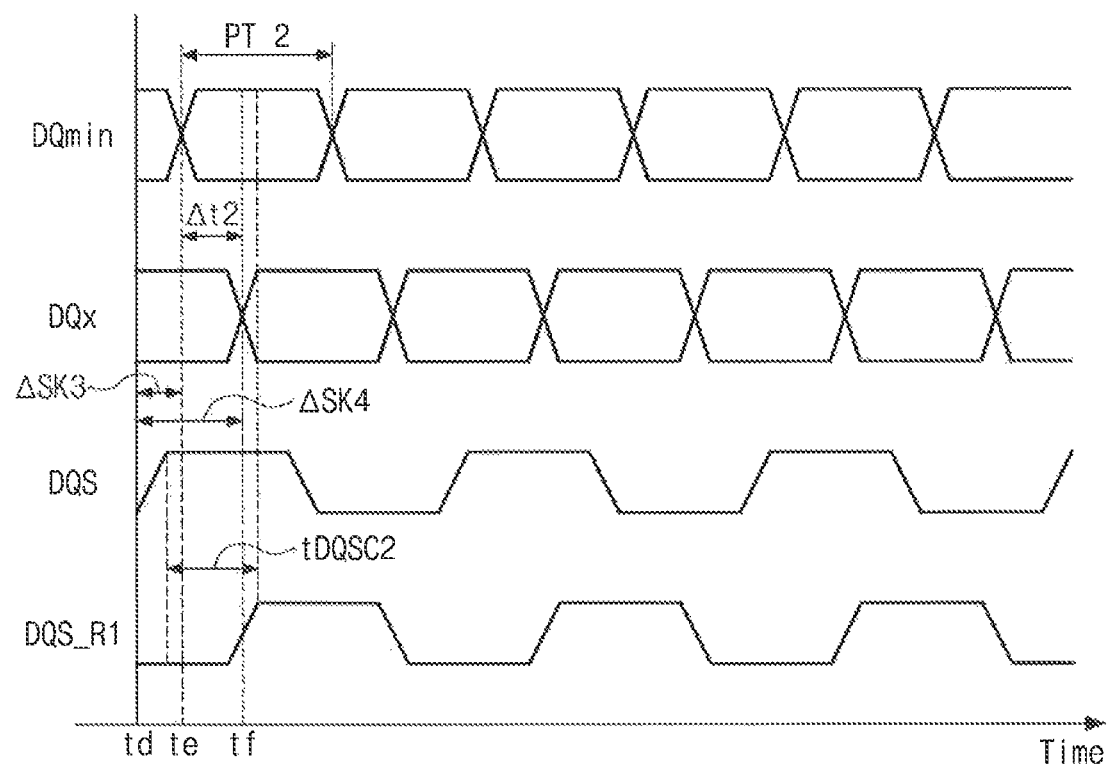
FIG. 12 is a timing diagram illustrating variations of signals generated by a memory system of FIG. 1, according to an exemplary embodiment of the inventive concept.

FIG. 12 is a timing diagram illustrating variations of signals generated by a memory system of FIG. 1, according to an exemplary embodiment of the inventive concept.

Hereinafter, the data signal DQ generated by the first rank 111_1 of FIG. 2 and signals associated with the data signal DQ generated by the first rank 111_1 will be described with reference to FIG. 12. As described with reference to FIG. 1, the data signal DQ may include "m" data signals. A data signal DQx of FIG. 12 may be one of the "m" data signals included in the data signal DQ. Accordingly, the data signal DQx may be generated by the first rank 111_1. Variations of data signals generated by the second to n-th ranks 111_2 to 111_n are similar to a variation of a data signal generated by the first rank 111_1, and thus, additional descriptions thereof will be omitted to avoid redundancy.

A specific time point of the "m" data signals (included in the data signal DQ) generated from the memory 110 may be aligned with a reference time point. For example, the specific time point may be a time point when data indicated by each of the data signal DQx and a data signal DQmin varies. In FIG. 12, the specific time point may be a time point te or a time point tf. The reference time point may be a time point when a logical value of the data strobe DQS starts to vary. In FIG. 12, the reference time point may be a time point td.

As described with reference to FIG. 8, the data signal DQx generated by the first rank 111_1 may include a skew having various lengths with regard to the data strobe DQS. In other words, the data signal DQx may lag behind or lead the data strobe DQS by a specific time length. The time point "tf" of the data signal DQx may deviate from the reference time point "td" of the data strobe DQS.

The data signal DQmin may be a data signal, which deviates by the shortest time length, from among the "m" data signals included in the data signal DQ. The time point "te" of the data signal DQmin may deviate from the reference time point "td" of the data strobe DQS. In FIG. 12, ΔSK4 may indicate a time length by which the data signal DQx deviates from the data strobe DQS. ΔSK3 may indicate the shortest time length of time lengths, by which data signals included in the data signal DQ deviate from the data strobe DQS. In other words, a time length by which the data signal DQmin deviates from the data strobe DQS.

The data strobe DQS of FIG. 12 may be the data strobe DQS of FIGS. 1 to 4. The data strobe DQS_R1 of FIG. 12 may be the data strobe DQS_R1 of FIGS. 3 to 6.

The data signal DQmin and the data signal DQx may have a length of a time interval PT 2 as a period. Accordingly, each of the data signal DQmin and the data signal DQx may indicate 1-bit data in the unit of the length of the time interval PT 2. Since a time length by which the data signal DQmin deviates from the data strobe DQS is shorter than a time length by which the data signal DQx deviates from the data strobe DQS, the data signal DQmin may lead the data signal DQx by a time interval Δt2. In other words, a start point of a period of the data signal DQmin may be separated from a start point of a period of the data signal DQx by the time interval Δt2.

The period of the data strobe DQS may be substantially identical to the period of the data signal DQx and the data signal DQmin. As described with reference to FIG. 4, the delay line 220_1 may delay the data strobe DQS based on the signal SLC_1 to output the data strobe DQS_R1. Accordingly, the data strobe DQS_R1 may lag the data strobe DQS by a time interval tDQSC2. In other words, a start point of a period of the data strobe DQS_R1 may be separated from a start point of a period of the data strobe DQS by the time interval tDQSC2. As described with reference to FIG. 1, the time interval tDQSC2 may have a length determined from the training described with reference to FIG. 7. The signal SLC_1 may indicate a length of the time interval tDQSC2.

For example, the controlling circuit 130 may determine a length of a time interval tDQSC2 based on a skew, e.g., ΔSK4, of the data signal DQmin obtained through the training. The time interval tDQSC2 may have a length for aligning the data strobe DQS with the data signal DQmin. In FIG. 12, the time interval tDQSC2 may have a length for aligning rising edges and falling edges of the data strobe DQS_R1, which is obtained by delaying the data strobe DQS, within time intervals when the data signal DQmin has a specific logical value. For example, a rising edge of the data strobe DQS_R1 may be aligned within the time interval PT 2. Accordingly, a time point when the data strobe DQS_R1 starts to have the logical value high may be aligned to the center of the time interval PT 2.

Figure 13:
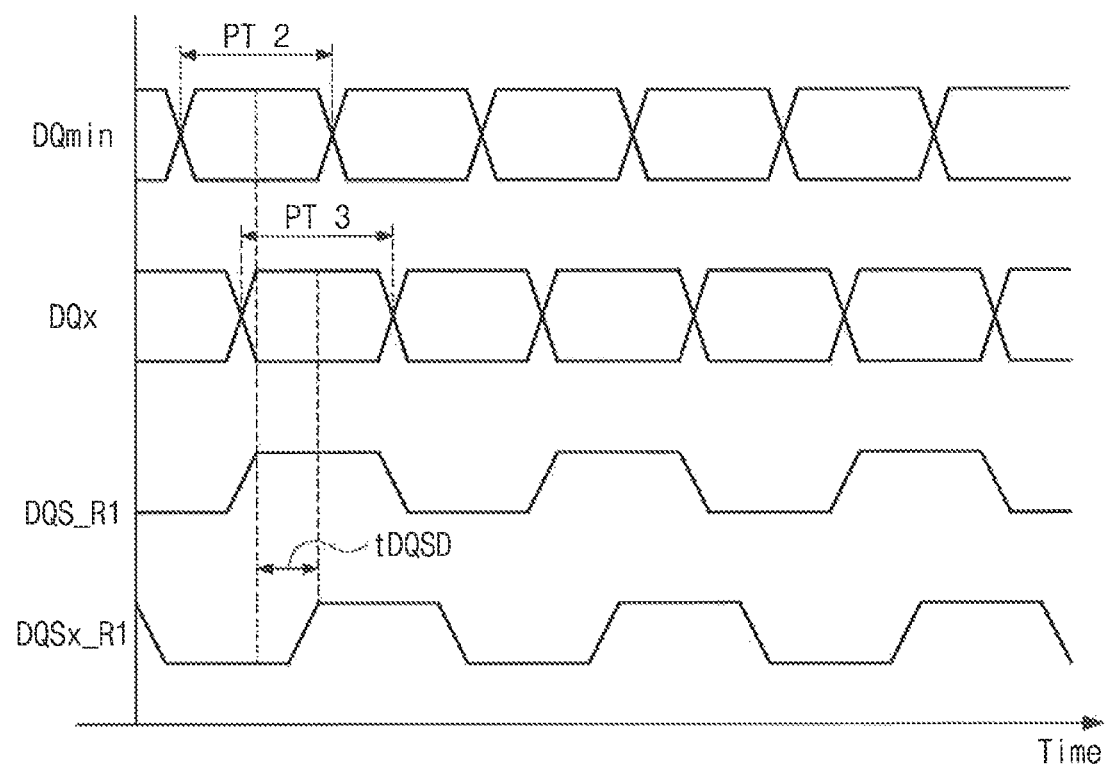
FIG. 13 is a timing diagram illustrating variations of signals generated by a memory system of FIG. 1, according to an exemplary embodiment of the inventive concept.

FIG. 13 is a timing diagram illustrating variations of signals generated by a memory system of FIG. 1, according to an exemplary embodiment of the inventive concept.

A data signal DQmin, a data signal DQx, and a data strobe DQS_R1 of FIG. 13 may be the data signal DQmin, the data signal DQx, and the data strobe DQS_R1 of FIG. 12, respectively. The delayed data strobe DQSx_R1 of FIG. 13 may correspond to one of the delayed data strobes DQS1_R1 to DQS1_Rn of FIG. 11.

As described with reference to FIG. 11, the merge circuit 300b may generate the delayed data strobe DQS1_R1 by delaying the data strobe DQS_R1 based on the signal SLD_DQS 1. For example, the delay line 310b_1 generates the delayed data strobe DQS1_R1. As in the above description, a merge circuit which has a configuration similar to the configuration of the merge circuit 300b of FIG. 11 may generate the delayed data strobe DQSx_R1 by delaying the data strobe DQS_R1.

Accordingly, the delayed data strobe DQSx_R1 may lag the data strobe DQS_R1 by a time interval tDQSD. As described with reference to FIG. 1, a time interval tDQSD may have a length determined in the training process of FIG. 7. A signal SLD_DQS 1 may indicate data associated with the time interval tDQSD.

For example, the controlling circuit 130 may determine a length of a time interval tDQSD based on a skew, e.g., ΔSK3, of the data signal DQx obtained through the training. The time interval tDQSD may have a length for aligning the delayed data strobe DQSx_R1 with the data signal DQx. In FIG. 13, the time interval tDQSD may have a length for aligning rising edges and falling edges of the delayed data strobe DQSx_R1, which is obtained by delaying the data strobe DQS_R1, within intervals when the data signal DQx has a specific logical value. For example, a rising edge of the delayed data strobe DQSx_R1 may be aligned within the time interval PT 3. Accordingly, a time point when the delayed data strobe DQSx_R1 starts to have the logical value high may be aligned with the center of the time interval PT 3.

The delayed data strobe DQSx_R1 aligned with the center of the time interval PT 3 is above described with reference to FIG. 13. However, the inventive concept may generate the delayed data strobe DQSx_R1 to be aligned with other parts of the time interval PT 3.

Through the method described with reference to FIGS. 12 and 13, the interface circuit 120 may delay the data strobes DQS_R1 to DQS_Rn based on the signal SLC such that the data strobes DQS_R1 to DQS_Rn are respectively aligned with the data signal DQmin. As described with reference to FIG. 1, the data signal DQ may include "m" data signals. The interface circuit 120 may delay the data strobes DQS_R1 to DQS_Rn based on the signal SLD such that the data strobes DQS_R1 to DQS_Rn are respectively aligned with the "m" data signals included in the data signal DQ.

Through the process described with reference to FIGS. 12 and 13, the interface circuit 120 may delay the data strobe DQS_R1 such that rising edges and falling edges of the data strobe DQS_R1 are aligned within time intervals where the data signal DQx has a specific logical value. As in the above-described process, rising edges and falling edges of the data strobes DQS_R2 to DQS_Rn may be respectively aligned with data signals included in the data signal DQ, and thus, additional descriptions thereof will be omitted to avoid redundancy.

Since the delayed data strobe DQSx_R1 is aligned with the data signal DQx, the sampling circuit 330b of FIG. 11 may sample the data signal DQx with a sufficient margin, based on the delayed data strobe DQSx_R1. As in the above description, the sampling circuit 330b of FIG. 11 may sample the data signal DQx with a sufficient margin based on the delayed data strobes DQSx_R2 to DQSx_Rn.

Figure 14:
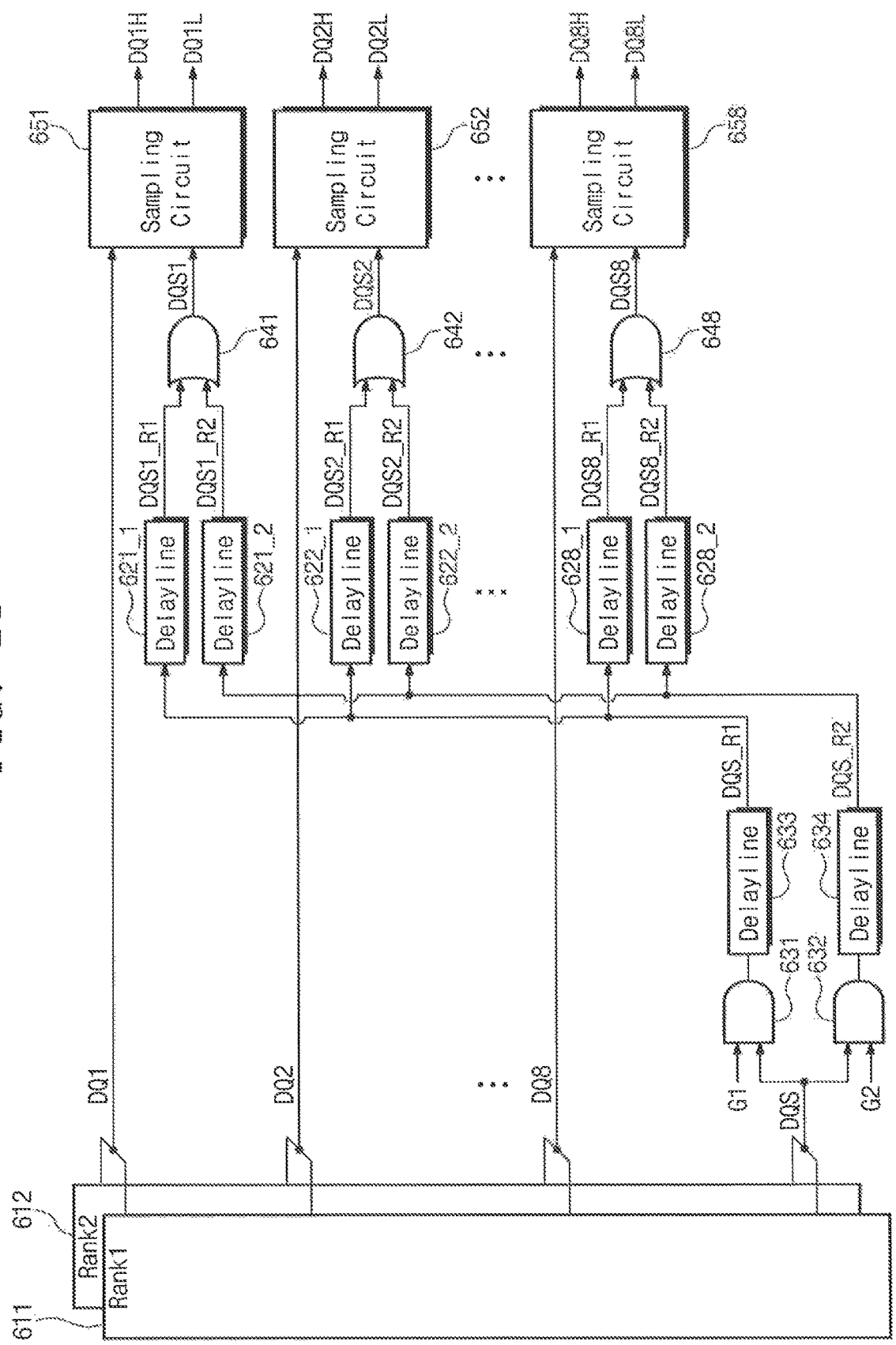
FIG. 14 is a block diagram illustrating a memory and an interface circuit of a merge circuit of FIG. 11, according to an exemplary embodiment of the inventive concept.

FIG. 14 is a block diagram illustrating a memory and an interface circuit of a merge circuit of FIG. 11, according to an exemplary embodiment of the inventive concept.

As described with reference to FIG. 1, the memory 110 may generate "m" data signals by "n" ranks. For example, a description will be given with respect to two ranks 611 and 612, for example, first and second ranks 611 and 612, and eight data signals DQ1 to DQ8 generated by the two ranks 611 and 612.

The memory 110 of FIG. 1 may include the first and second ranks 611 and 612 of FIG. 14. The DQS split circuit 121 of FIG. 3 may include AND operators 631 and 632 and delay lines 633 and 634 of FIG. 14. The merge circuit 122 of FIG. 3 may include delay lines 621_1 to 628_1, delay lines 621_2 to 628_2, OR operators 641 to 648, and sampling circuits 651 to 658 of FIG. 14.

Configurations and operations of the ranks 611 and 612 of FIG. 14 are similar to those described with reference to the first and second ranks 111_1 and 111_2 of FIG. 2, and thus, additional descriptions thereof will be omitted to avoid redundancy. Configurations and operations of the AND operators 631 and 632 and the delay lines 633 and 634 of FIG. 14 are similar to those described with reference to the AND operators 210_1 to 210_n and the delay lines 220_1 to 220_n of FIG. 4, and thus, additional descriptions thereof will be omitted to avoid redundancy. Configurations and operations of the delay lines 621_1 to 628_1, the delay lines 621_2 to 628_2, the OR operators 641 to 648, and the sampling circuits 651 to 658 of FIG. 14 are similar to those described with reference to the delay lines 310b_1 to 310b_n, the OR operator 320b, and the sampling circuit 330b of FIG. 11, and thus, additional descriptions thereof will be omitted to avoid redundancy.

One of the first and second ranks 611 and 612 may generate the data signals DQ1 to DQ8 under control of the controlling circuit 130. The AND operators 631 and 632 and the delay lines 633 and 634 may generate data strobes DQS_R1 and DQS_R2 in response to the first and second gate signals G1 and G2, respectively. The AND operators 631 and 632 are both provided with the data strobe DQS.

The delay lines 621_1 to 628_1 may delay the data strobe DQS_R1 to respectively generate the delayed data strobes DQS1_R1 to DQS8_R1. The delay lines 621_2 to 628_2 may delay the data strobe DQS_R2 to respectively generate the delayed data strobes DQS1_R2 to DQS8_R2. The OR operators 641 to 648 may respectively generate the delayed data strobes DQS1 to DQS8 based on the delayed data strobes DQS1_R1 to DQS8_R1 and the delayed data strobes DQS1_R2 to DQS8_R2. The sampling circuits 651 to 658 may generate the data signal highs DQ1H to DQ8H and the data signal lows DQ1L to DQ8L by sampling the data signals DQ1 to DQ8 based on the delayed data strobes DQS1 to DQS8. Each of the sampling circuits 651 to 658 is provided with a respective one of the data signals DQ1 to DQ8.

Referring to FIGS. 10 and 14, the number of the sampling circuits 651 to 658 for processing the data signals DQ1 to DQ8 generated from the two ranks 611 and 612 of FIG. 14 may be smaller than the number of the sampling circuits 541_1 to 548_1 and 541_2 to 548_2 for processing the data signals DQ1 to DQ8 generated from the two ranks 511 and 512 of FIG. 10. The sampling circuits 651 to 658 may be used in a small area. Accordingly, the interface circuit 120 according to the configuration of FIG. 14 may consume less power than the interface circuit 120 according to the configuration of FIG. 10. In addition, the interface circuit 120 according to the configuration of FIG. 14 may be placed in a smaller area than the interface circuit 120 according to the configuration of FIG. 10.

Figure 15:
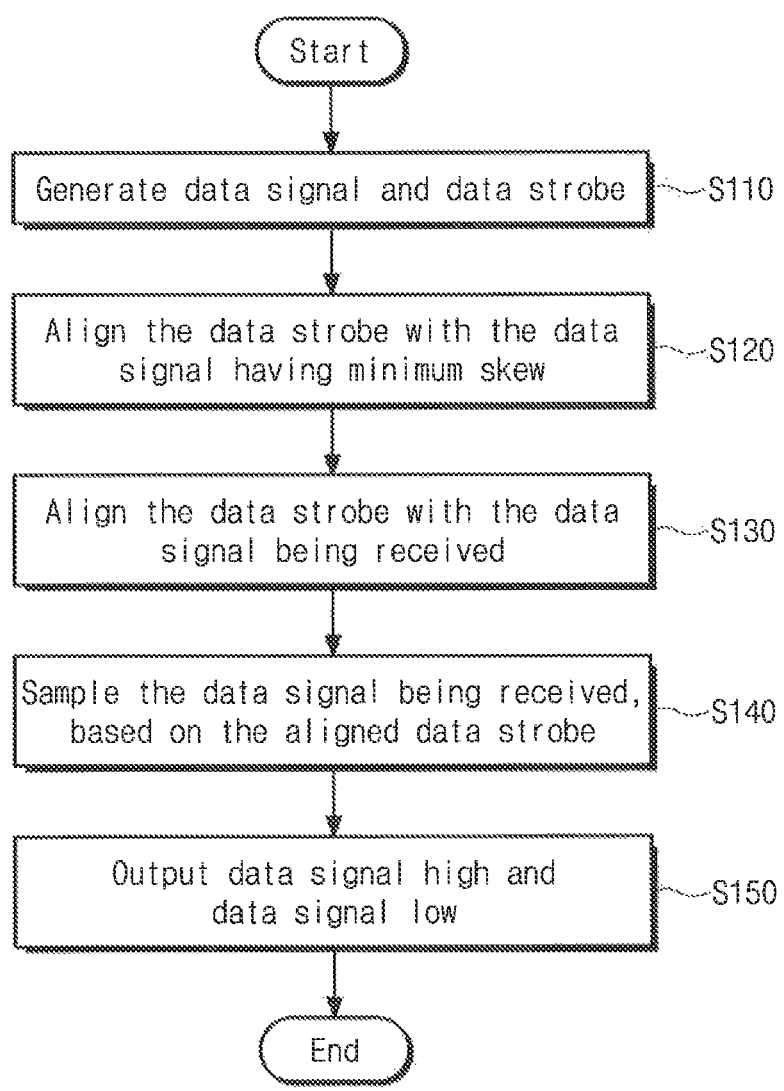
FIG. 15 is a flowchart illustrating an operation of a memory system of FIG. 1, according to an exemplary embodiment of the inventive concept.

FIG. 15 is a flowchart illustrating an operation of a memory system of FIG. 1, according to an exemplary embodiment of the inventive concept.

In operation S110, the memory 110 may generate the data signal DQ and the data strobe DQS. For example, the first rank 111_1 of the memory 110 may generate the data signal DQ and the data strobe DQS.

In operation S120, the interface circuit 120 may align the data strobe DQS with the data signal DQ as the data signal DQ deviates by a specific time length with respect to a reference time. As described with reference to FIG. 12, the data signal DQ may deviate from the data strobe DQS by various time lengths. The interface circuit 120 may align the data strobe DQS with the data signal DQmin, which deviates from the data strobe DQS by the shortest time length of the various time lengths. For example, the data strobe DQS is aligned with the data signal DQmin which is a data signal having a minimum skew among "m" data signals included in the data signal DQ.

In operation S130, the interface circuit 120 may align the data strobe DQS with the data signal DQ. As described with reference to FIG. 13, the interface circuit 120 may delay the data strobe DQS to generate the delayed data strobe DQSx. The delayed data strobe DQSx may be aligned with the data signal DQ.

In operation S140, the interface circuit 120 may sample the data signal DQ based on the data strobe aligned in operation S130. As described with reference to FIG. 6, the interface circuit 120 may sample the data signal DQ in response to a rising edge and a falling edge of the delayed data strobe DQSx. The interface circuit 120 may generate the data signal high DQH by sampling the data signal DQ in response to the rising edge of the delayed data strobe DQSx. The interface circuit 120 may generate the data signal low DQL by sampling the data signal DQ in response to the falling edge of the delayed data strobe DQSx.

In operation S150, the interface circuit 120 may output the data signal high DQH and the data signal low DQL to the controlling circuit 130.

Figure 16:
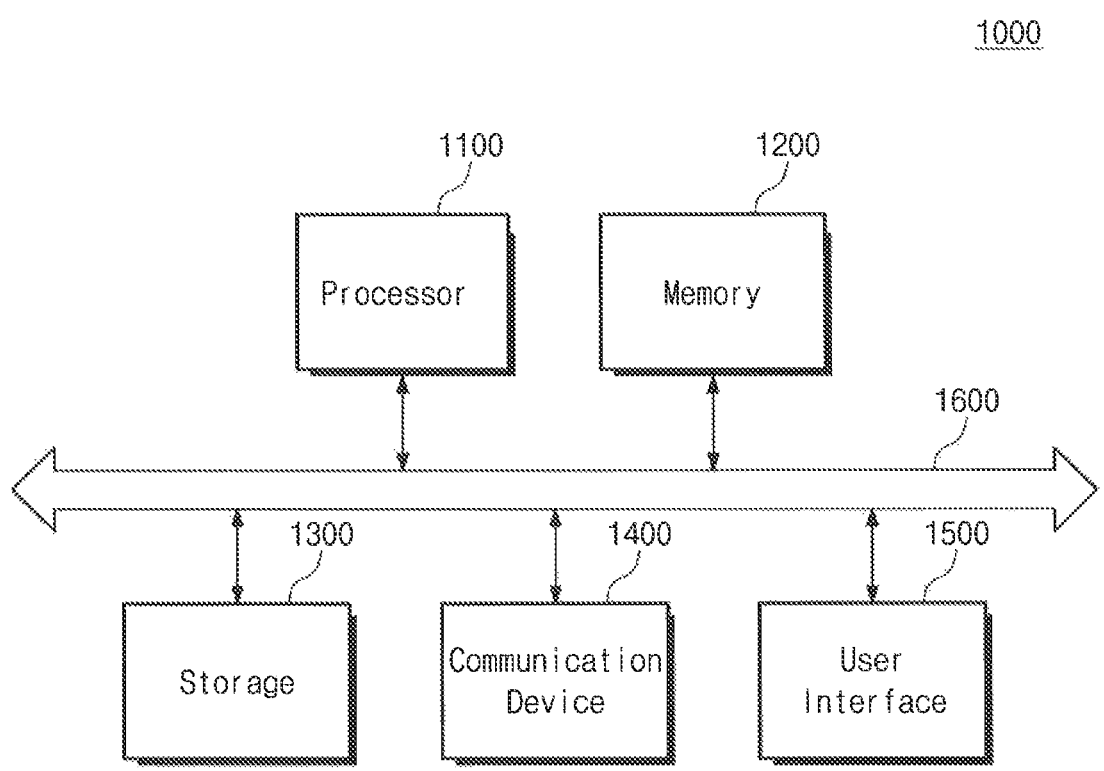
FIG. 16 is a block diagram illustrating an electronic device including a memory system of FIG. 1, according to an exemplary embodiment of the inventive concept.

FIG. 16 is a block diagram illustrating an electronic device including a memory system of FIG. 1, according to an exemplary embodiment of the inventive concept.

For example, an electronic device 1000 may be one of a personal computer (PC), a workstation, a notebook computer, a mobile device, etc. Referring to FIG. 16, the electronic device 1000 may include a processor 1100, a memory 1200, storage 1300, a communication device 1400, a user interface 1500, and a bus 1600. The electronic device 1000 may further include a variety of other components. Alternatively, the electronic device 1000 may not fewer than all of the components illustrated in FIG. 16.

The processor 1100 may control overall operations of the electronic device 1000. The processor 1100, which is a central control device, may process operations needed to operate the electronic device 1000. For example, the processor 1100 may process data for controlling operations of the electronic device 1000. For example, the processor 1100 may include the interface circuit 120 and the controlling circuit 130 of FIG. 1. The processor 1100 may control overall operations of the memory 1200.

For example, the processor 1100 may receive the data signal DQ and the data strobe DQS from the memory 1200. The processor 1100 may sample the data signal DQ based on the data strobe DQS. The processor 1100 may generate the signal SLC and the signal SLD used to sample the data signal DQ. For example, the processor 1100 may be one of a general-purpose processor, a workstation processor, an application processor, etc.

The memory 1200 may store data processed or to be processed by the processor 1100. For example, the memory 1200 may support a multi-rank system. The memory 1200 may include the memory system 100 of FIG. 1. For example, the memory 1200 may include a volatile memory or a nonvolatile memory. Alternatively, the memory 1200 may include heterogeneous memories.

For example, the memory 1200 may include an interface circuit and a memory controller configured to control overall operations of the memory 1200. For example, the interface circuit may include the interface circuit 120 of FIG. 1. For example, the memory controller may include the controlling circuit 130 of FIG. 1.

The storage 1300 may store data in the absence of power. For example, the storage 1300 may include a nonvolatile memory. The communication device 1400 may include a transmission unit and a reception unit. The electronic device 1000 may communicate with another electronic device through the communication device 1400 to transmit and/or receive data. The user interface 1500 may convey a command or an input/output of data between a user and the electronic device 1000.

The bus 1600 may provide a communication path between the components of the electronic device 1000. For example, the processor 1100, the memory 1200, the storage 1300, the communication device 1400, and the user interface 1500 may exchange data with each other through the bus 1600. For example, the memory 1200 may transfer the data signal DQ and the data strobe DQS through the bus 1600. The bus 1600 may be configured to support various types of communication formats used in the electronic device 1000.

According to an exemplary embodiment of the inventive concept, power consumption of a memory system may be reduced, and the area of an interface circuit for the memory system may decrease.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An electronic circuit, comprising:
 a first delay line circuit configured to generate a first data strobe by delaying a second data strobe, such that an edge of the first data strobe is aligned within a first time interval where a first data signal has one logical value; and
 a sampling circuit configured to sample the first data signal in response to the edge of the first data strobe,
 wherein a plurality of data signals include the first data signal and a second data signal, wherein timings of the plurality of data signals deviate from a reference timing of a reference data strobe by a plurality of time lengths,
 wherein a timing of the first data signal deviates from the reference timing by a first time length of the plurality of time lengths, and
 wherein an edge of the second data strobe is aligned within a second time interval in which the second data signal has one logical value, wherein a timing of the second data signal deviates from the reference timing by a shortest time length of the plurality of time lengths.

2. The electronic circuit of claim 1, further comprising:
 a first logic circuit configured to output the first data strobe to the sampling circuit.

3. The electronic circuit of claim 1, further comprising:
 a split circuit configured to delay the reference data strobe such that the edge of the second data strobe is aligned within the second time interval.

4. The electronic circuit of claim 3, wherein the split circuit includes:
 a second logic circuit configured to output the reference data strobe in response to a gate signal received from a memory controller; and
 a second delay line circuit configured to output the second data strobe by delaying the reference data strobe output from the second logical circuit.

5. The electronic circuit of claim 4, wherein the first data signal is generated by a rank included in a memory.

6. The electronic circuit of claim 5, wherein the second logic circuit receives the gate signal, which corresponds to the rank generating the first data signal, from the memory controller.

7. The electronic circuit of claim 1, wherein the edge of the first data strobe includes a first edge and a second edge, wherein the sampling circuit is configured to:
 generate a data signal high by sampling the first data signal in response to the first edge of the first data strobe; and
 generate a data signal low by sampling the first data signal in response to the second edge of the first data strobe.

8. An electronic circuit, comprising:
 a merge circuit configured to generate a first data strobe by delaying a second data strobe, such that an edge of the first data strobe is aligned within a first time interval where a first data signal has one logical value, and to sample the first data signal in response to the edge of the first data strobe, wherein a timing of the first data signal deviates from a reference timing of a reference data strobe by a first time length; and
 a split circuit configured to generate the second data strobe by delaying the reference data strobe, such that an edge of the second data strobe is aligned within a second time interval where a second data signal has one logical value, wherein a timing of the second data signal deviates from the reference timing by a second time length,
 wherein a plurality of data signals include the first data signal and the second data signal, wherein timings of the plurality of data signals deviate from the reference timing by a plurality of time lengths, and
 wherein the second time length is a shortest time length among the plurality of time lengths.

9. The electronic circuit of claim 8, wherein the merge circuit includes
 a sampling circuit configured to sample the first data signal.

10. The electronic circuit of claim 8, wherein the split circuit is configured to:
 delay the reference data strobe in response to a gate signal received from a memory controller.

11. The electronic circuit claim 8, wherein the merge circuit is configured to delay the second data strobe by a third time length determined from a training.

12. The electronic circuit of claim 10, wherein the first data signal is received from a rank included in a memory.

13. The electronic circuit of claim 12, wherein the gate signal corresponds to the rank, which generates the first data signal.

14. An electronic circuit, comprising:
 a first delay line circuit configured to generate a first data strobe by adjusting a timing of a second data strobe generated from a reference data strobe; and
 a sampling circuit configured to sample a first data signal based on the first data strobe, wherein a timing of the first data signal deviates from the reference data strobe by a first time length,
 wherein a second data signal is one of a plurality of data signals, wherein timings of the plurality of data signals deviate from the reference timing by a plurality of time lengths, and
 wherein a second data strobe has a timing for sampling the second data signal, wherein a timing of the second data signal deviates from the reference data strobe by a minimum time length of the plurality of time lengths.

15. The electronic circuit of claim 14, further comprising:
 a second delay line circuit configured to generate a third data strobe by adjusting a timing of a fourth data strobe generated from the reference data strobe; and
 a first logic circuit configured to selectively output one of the first data strobe and the third data strobe to the sampling circuit,
 wherein the first data strobe is associated with a first rank included in a memory, and the third data strobe is associated with a second rank included in the memory.

16. The electronic circuit of claim 15, wherein the reference data strobe is generated from one of the first rank and the second rank,
 wherein the electronic circuit further comprises:
 a split circuit configured to:
 generate the second data strobe by adjusting a timing of the reference data strobe when the reference data strobe is generated from the first rank; and generate the fourth data strobe by adjusting the timing of the reference data strobe when the reference data strobe is generated from the second rank.

17. The electronic circuit of claim 16, wherein the split circuit includes:
   a second logic circuit configured to output the reference data strobe in response to a first gate signal received from a memory controller when the reference data strobe is generated from the first rank;
   a third logic circuit configured to output the reference data strobe in response to a second gate signal received from the memory controller when the reference data strobe is generated from the second rank;
   a third delay line circuit configured to generate the second data strobe by delaying the reference data strobe output from the second logic circuit; and
   a fourth delay line circuit configured to generate the fourth data strobe by delaying the reference data strobe output from the third logic circuit.

18. The electronic circuit of claim 17, wherein the first data signal is selectively generated by one rank included in the memory, and
   wherein the first gate signal corresponds to the first rank and the second gate signal corresponds to the second rank.

19. The electronic circuit of claim 14, wherein the first delay line circuit generates the first data strobe such that an edge of the first data strobe is aligned within a time interval where the first data signal indicates one logical value.

20. The electronic circuit of claim 14, wherein the sampling circuit includes:
   a first flip-flop configured to sample the first data signal in response to a first edge of the first data strobe; and
   a second flip-flop configured to sample the first data signal in response to a second edge of the first data strobe.

* * * * *